United States Patent
Nakamura et al.

(10) Patent No.: US 10,070,528 B2
(45) Date of Patent: Sep. 4, 2018

(54) SEMICONDUCTOR DEVICE WIRING PATTERN AND CONNECTIONS

(71) Applicant: FUJI ELECTRIC CO., LTD., Kawasaki-shi (JP)

(72) Inventors: Hideyo Nakamura, Matsumoto (JP); Masafumi Horio, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/685,747

(22) Filed: Apr. 14, 2015

(65) Prior Publication Data

US 2015/0223339 A1    Aug. 6, 2015

Related U.S. Application Data

(63) Continuation of application No. PCT/JP2013/005791, filed on Sep. 27, 2013.

(30) Foreign Application Priority Data

Oct. 15, 2012  (JP) .................................. 2012-228370

(51) Int. Cl.
H01L 23/02 (2006.01)
H05K 1/18 (2006.01)
(Continued)

(52) U.S. Cl.
CPC .............. H05K 1/181 (2013.01); H01L 23/04 (2013.01); H01L 23/3107 (2013.01);
(Continued)

(58) Field of Classification Search
CPC ............. H01L 25/072; H01L 23/49833; H01L 2224/73265; H01L 2224/97; H01L 21/56
See application file for complete search history.

(56) References Cited

U.S. PATENT DOCUMENTS 8,593,817 B2 * 11/2013 Bayerer ................. H01L 24/06
174/529
2001/0015478 A1    8/2001 Tsunoda et al.
(Continued)

FOREIGN PATENT DOCUMENTS

JP    2001-284524 A    10/2001
JP    2002-373971 A    12/2002
(Continued)

OTHER PUBLICATIONS

M. Horio et al., "Ultra compact and high reliable SiC MOSFET power module with 200° C. operating capability", 2012 24th International Symposium on Power Semiconductor Devices and ICs (ISPSD), Jun. 3-7, 2012, pp. 81-84.

*Primary Examiner* — Khiem D Nguyen
(74) *Attorney, Agent, or Firm* — Rabin & Berdo, P.C.

(57) ABSTRACT

A semiconductor device, while being small, makes it possible to achieve low inductance responding to high speed switching. The semiconductor device includes a plurality of conductive pattern members, on each of which is mounted one or a plurality of power semiconductor chips, and a printed circuit board wherein a chip rod-form conductive connection member connected to the power semiconductor chip and a pattern rod-form conductive connection member connected to the conductive pattern member are disposed on the surface opposing the conductive pattern member. The conductive pattern member is formed of a narrow portion and a wide portion, the narrow portion of at least one conductive pattern member and the printed circuit board are connected by the pattern rod-form conductive connection member, and a current path is formed between the conductive pattern member and the power semiconductor chip connected via the chip rod-form conductive connection member to the printed circuit board.

22 Claims, 20 Drawing Sheets

(51) Int. Cl.
  *H01L 23/373* (2006.01)
  *H01L 25/07* (2006.01)
  *H01L 23/498* (2006.01)
  *H01L 23/31* (2006.01)
  *H01L 23/00* (2006.01)
  *H05K 1/02* (2006.01)
  *H05K 7/20* (2006.01)
  *H05K 3/34* (2006.01)
  *H01L 23/04* (2006.01)
  *H01L 25/18* (2006.01)
  *H01L 21/56* (2006.01)

(52) U.S. Cl.
  CPC .... *H01L 23/3735* (2013.01); *H01L 23/49833* (2013.01); *H01L 24/17* (2013.01); *H01L 25/072* (2013.01); *H05K 1/0212* (2013.01); *H05K 1/0296* (2013.01); *H05K 3/3447* (2013.01); *H05K 7/2089* (2013.01); *H01L 21/565* (2013.01); *H01L 25/18* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01); *H01L 2924/00014* (2013.01); *H01L 2924/1305* (2013.01); *H01L 2924/13055* (2013.01); *H01L 2924/13091* (2013.01); *H01L 2924/181* (2013.01); *H01L 2924/30107* (2013.01); *H05K 1/0243* (2013.01); *H05K 2201/0364* (2013.01); *H05K 2201/06* (2013.01); *H05K 2201/09972* (2013.01)

(56) References Cited

U.S. PATENT DOCUMENTS

| | | | |
|---|---|---|---|
| 2004/0113268 A1* | 6/2004 | Shirakawa | H01L 23/5383 257/724 |
| 2010/0001291 A1* | 1/2010 | Otremba | H01L 21/561 257/77 |
| 2010/0134979 A1* | 6/2010 | Obiraki | H01L 23/3735 361/709 |
| 2011/0187003 A1 | 8/2011 | Oi et al. | |
| 2013/0277849 A1 | 10/2013 | Fukuda | |

FOREIGN PATENT DOCUMENTS

| | | | | |
|---|---|---|---|---|
| JP | 2003-230286 A | | 8/2003 | |
| JP | 2004-214452 A | | 7/2004 | |
| JP | 2009-064852 | * | 3/2009 | ............. H01L 25/07 |
| JP | 2009-064852 A | | 3/2009 | |
| JP | 2010-118699 A | | 5/2010 | |
| JP | 2010-129867 A | | 6/2010 | |
| JP | 2010-165764 A | | 7/2010 | |
| JP | 2011-142124 A | | 7/2011 | |
| JP | 2012-119618 A | | 6/2012 | |
| JP | 2012-129336 | * | 7/2012 | ............. H01L 25/07 |
| JP | 2012-129336 A | | 7/2012 | |
| WO | WO-2012/111397 A1 | | 8/2012 | |

* cited by examiner

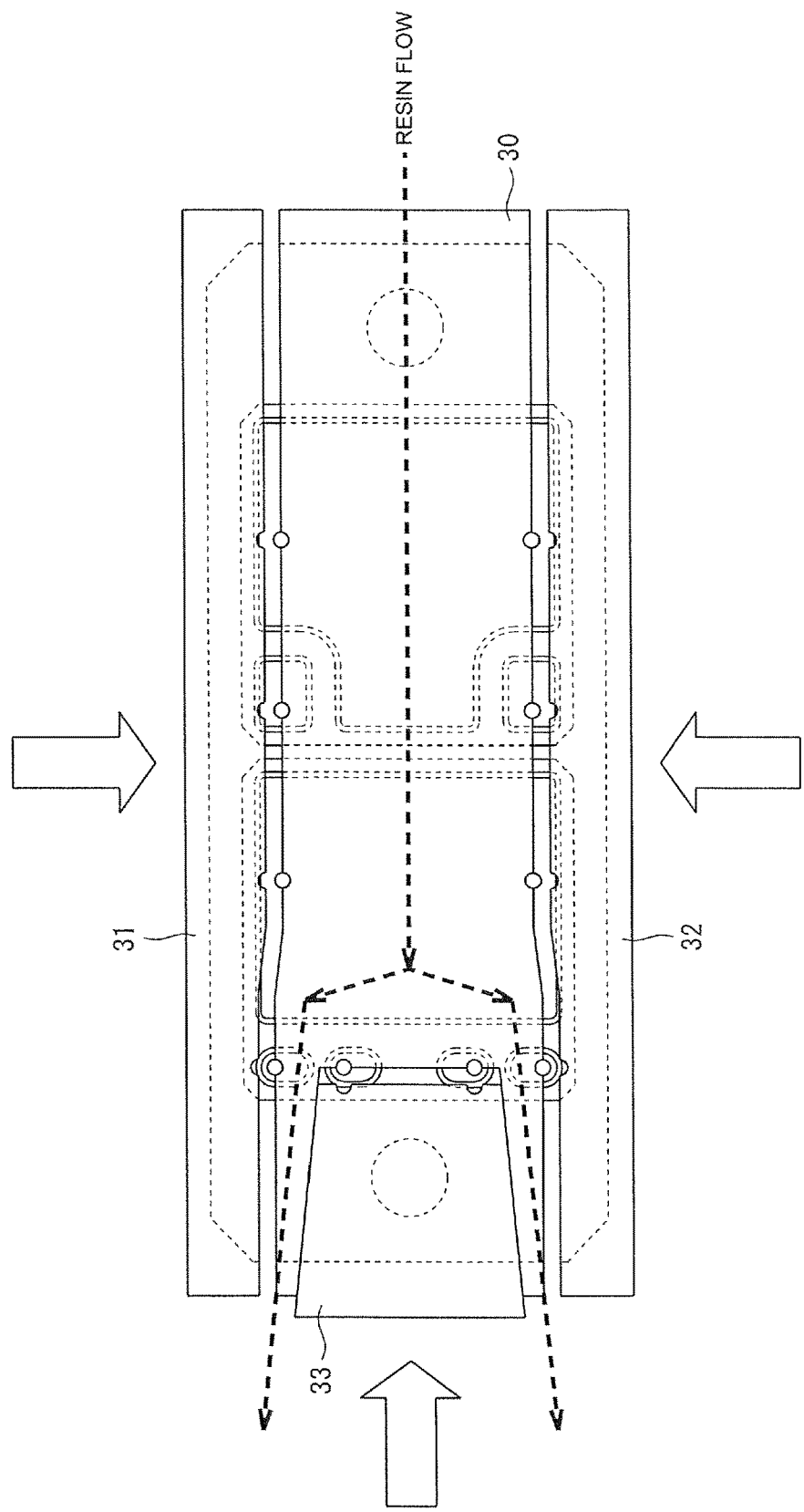

SEMICONDUCTOR DEVICE WIRING PATTERN AND CONNECTIONS

This application is a continuation under 35 U.S.C. 120 of International Application PCT/JP2013/005791 having the International Filing Date of Sep. 27, 2013, and having the benefit of the earlier filing date of Japanese Application No. 2012-228370, filed Oct. 15, 2012. Each of the identified applications is fully incorporated herein by reference.

TECHNICAL FIELD

The present invention relates to a semiconductor device in which is mounted a power semiconductor chip.

BACKGROUND ART

A power semiconductor module is used in an inverter device configuring, for example, a power conversion device.

The semiconductor device shown in, for example, FIG. 15 has been proposed as an existing semiconductor device.

This existing semiconductor device is given as an example of, for example, a 2-in-1 semiconductor module 100.

The semiconductor module 100 is such that a conductor patterned insulating substrate (ceramic insulating substrate) 102 is joined by a solder 103 onto a heat releasing metal base plate 101. The conductor patterned insulating substrate 102 has a ceramic substrate 102a, and is configured of a conductor pattern 102b bonded to the front surface of the ceramic substrate 102a and a back surface conductive film 102c bonded to the back surface of the ceramic substrate 102a.

A semiconductor chip (semiconductor power chip) 104 is mounted across a solder 105 on the conductor pattern 102b of the conductor patterned insulating substrate 102.

Further, the metal base plate 101, conductor patterned insulating substrate 102, and semiconductor chip 104 are disposed inside a box-form resin case 106 of which the lower end is opened, and fixed inside the resin case 106 by injecting a resin sealing material. 107 is a metal bar terminal that forms an external lead-out terminal soldered to the conductor pattern 102b, and 108 is bonding wire that connects semiconductor chips 104, or the semiconductor chip 104 and the conductor pattern 102b.

A highly reliable semiconductor device having excellent operating characteristics, and having high productivity, wherein deformation due to thermal expansion or the like is prevented by a semiconductor chip being disposed on a conductor patterned insulating substrate, a large number of post electrodes fixed to a printed circuit board being fixed to the semiconductor chip and conductor pattern, and a metal foil being formed on the front and back of the printed circuit board, thus securing heat releasing properties, has been proposed as another existing example (for example, refer to PTL 1).

Also, there has also been proposed a power semiconductor module, which is a power semiconductor module formed of a series connection circuit of a power semiconductor device (IGBT) and a diode (FWD) connected in anti-parallel thereto, wherein the inductance value inside the power semiconductor module is reduced to practically zero by an electrode bar connected to a first power supply potential output electrode or the like, an electrode bar connected to an additional electrode or the like, and an electrode bar connected to a second power supply potential output electrode or the like each being formed in plate form, and disposed across an insulator in close proximity to each other (for example, refer to PTL 2).

Furthermore, there has also been proposed a power semiconductor device wherein a rectangular ring-form wiring substrate is disposed on an upper portion of a bottom surface substrate so as to cover end and edge portions of the bottom surface substrate, a main collector electrode terminal and a main emitter electrode terminal are passed through an aperture portion in a central portion of the wiring substrate and caused to protrude from an aperture portion of a resin case, and a control emitter pad and gate pad are electrically connected via wires of equal length to a control emitter electrode and gate electrode (for example, refer to PTL 3).

Further still, there has also been proposed a semiconductor device including a semiconductor device unit in which is sealed a semiconductor chip, a wiring substrate, and a bolt fastening unit, wherein at least the semiconductor device unit and bolt fastening unit are fixed using an elastic adhesive, and the semiconductor device unit is configured of a copper block, a conductor patterned insulating substrate, an IGBT chip, a diode chip, a collector terminal pin, a printed circuit board to which is fixed an implant pin, an emitter terminal pin, a control terminal pin, a collector terminal pin, and a resin case in which these are sealed (for example, refer to PTL 4).

Also, there has been proposed a power semiconductor module including at least an insulating substrate, on which is mounted a power semiconductor chip and which has a copper plate and an insulating plate, a printed circuit board with pin connected to the power semiconductor chip, a connection terminal and insulating substrate connected to the copper plate, and a cuboid resin sealing member in the interior of which the printed circuit board with pin is encapsulated, wherein an emitter side connection terminal, a collector side connection terminal, and an output terminal are disposed in a row along a side edge of the resin sealing member on either side portion of the resin sealing member, and a gate terminal and emitter signal terminal are disposed in a row along one longitudinal direction end edge (for example, refer to PTL 5).

CITATION LIST

Patent Literature

PTL 1: JP-A-2009-64852
PTL 2: JP-A-2004-214452
PTL 3: JP-A-2010-118699
PTL 4: JP-A-2011-142124
PTL 5: JP-A-2012-119618

However, the heretofore described existing example illustrated in FIG. 15 is such that, as there is a need to route thin bonding wire, it is difficult to reduce inductance in order to respond to high speed switching, and an external connection terminal is soldered to the conductor pattern, because of which there is an unresolved problem in that attachment of the external connection terminal cannot be carried out accurately. Furthermore, a pattern that routes wiring connected to the bonding wire has to be disposed on the insulating substrate, because of which size reduction is difficult, productivity and ease of assembly deteriorate, the structure becomes complex, and the heat releasing properties decrease.

Also, the existing example described in PTL 1 is such that a post electrode (pin) shorter than bonding wire and with a larger sectional area is used, because of which inductance can be reduced, and two tier wiring of an insulating substrate and printed circuit board can be adopted, because of which size reduction is also possible. However, as no consideration is given to reducing the wiring inductance between the printed circuit board and insulating substrate, the existing configuration is insufficient for adequately fulfilling the capability of a high speed switching element typified by SiC or the like. Also, full mold technology using transfer molding or the like can be considered as means of forming a module inexpensively, but the form disclosed in PTL 1 is not necessarily suited to molding.

Furthermore, the existing example described in PTL 2 is effective means in that wiring inductance can be reduced to practically zero by stacking current paths, and mutual inductance can be considerably reduced, but there are various demands regarding form in an actual semiconductor package, and in particular, when a pin form is adopted for an external terminal, and the external terminal is protruded upward, in order to be connected with the printed circuit board, or the like, it is clear that there exist regions in which positive electrode side and negative electrode side power supply wiring cannot be formed in a stacked structure, and even in places in which the wiring is stacked, mutual inductance can be reduced to "0" only in places in which the current directions are completely opposed, because of which it is difficult to rely only on this method. Furthermore, as it is often the case that a pad of a width of 1 mm or less is employed for a small semiconductor chip, it is difficult to mechanically join a plurality of chips while stacking bus bars. In the case of a small chip, employment of wire bonding and the post electrode described in PTL 1 is unavoidable. In particular, as is commonly known, it is often the case that SiC or the like is a small chip, because of the wafer defect density.

Also, generally, the smaller the module size, the thinner the wire becomes, and the more difficult it becomes to adopt a measure such as stacking, because of which it is often the case that inductance increases.

Further still, the existing example described in PTL 3 is such that the main collector terminal and main emitter terminal are disposed on the bottom surface substrate via a main collector substrate and main emitter substrate, and the control emitter pad and gate pad are connected via wire to the IGBT element, connected to the wiring substrate via a control emitter relay terminal and gate relay terminal, and electrically connected to a control emitter electrode and gate electrode provided on the wiring substrate. Therefore, there is an unresolved problem in that the linking structure of an external connection terminal is complex, and ease of assembly and productivity decrease.

Also, the existing example described in PTL 4 is such that, as the collector terminal pin is connected by soldering to a second copper block of the insulating substrate, and the emitter terminal pin and control terminal pin are connected to the printed circuit board, there is an unresolved problem in that disposition and connection of an external connection terminal cannot be carried out easily, and ease of assembly and productivity decrease.

In the same way, the existing example described in PTL 5 is such that, as the collector side connection terminal and emitter side connection terminal are fixed to differing first copper plates of the insulating substrate, and the gate terminal and emitter signal terminal are fixed to the printed circuit board, there is an unresolved problem in that disposition and connection of an external connection terminal cannot be carried out easily, and ease of assembly and productivity decrease.

Therefore, the invention, having been contrived focusing on the unresolved problems of the heretofore described existing examples, has an object of providing a semiconductor device such that, while being small, it is possible to achieve low inductance responding to high speed switching.

SUMMARY

In order to achieve the heretofore described object, a first aspect of a semiconductor device according to the invention includes a plurality of conductive pattern members, on each of which is mounted one or a plurality of power semiconductor chips, and a printed circuit board wherein a chip rod-form conductive connection member connected to the power semiconductor chip and a pattern rod-form conductive connection member connected to the conductive pattern member are disposed on the surface opposing the conductive pattern member. Further, the conductive pattern member is formed of a narrow portion and a wide portion, the narrow portion of at least one conductive pattern member and the printed circuit board are connected by the pattern rod-form conductive connection member, and a current path is formed between the conductive pattern member and the power semiconductor chip connected via the chip rod-form conductive connection member to the printed circuit board.

Also, a second aspect of the semiconductor device according to the invention is such that a wiring pattern of the printed circuit board is disposed so that the signs of the change rate of current flowing through the conductive pattern member and the change rate of current flowing through the printed circuit board opposing the conductive pattern member are positive and negative opposite signs.

Also, a third aspect of the semiconductor device according to the invention further includes a terminal connection pattern member formed on the outer side of the narrow portion and connecting an external connection terminal.

Also, a fourth aspect of the semiconductor device according to the invention is such that the conductive pattern member is configured of a copper pattern of a thickness of 0.5 mm or more, 1.5 mm or less.

Also, a fifth aspect of the semiconductor device according to the invention is such that the terminal connection pattern member is configured of a copper pattern of a thickness of 0.5 mm or more, which can hold the external connection terminal.

Also, a sixth aspect of the semiconductor device according to the invention is such that the plurality of conductive pattern members are disposed on individual insulating substrates.

Also, a seventh aspect of the semiconductor device according to the invention is such that the plurality of conductive pattern members are disposed on the same insulating substrate.

Also, an eighth aspect of the semiconductor device according to the invention is such that a heat releasing heat transferring pattern member is formed on the side of the insulating substrate opposite to the surface on which the conductive pattern member is formed, and the number of heat releasing heat transferring pattern members is set to be the same as, or smaller than, the number of conductive pattern members.

Also, a ninth aspect of the semiconductor device according to the invention is such that a main circuit wiring pattern is formed on both the front and back surface of the printed circuit board, and the two main circuit wiring patterns have the same potential.

Also, a tenth aspect of the semiconductor device according to the invention further includes a sealing member encapsulating in the interior thereof the conductive pattern member and the printed circuit board, wherein the external connection terminals protrude in the same direction from the sealing member, and are disposed arrayed in the longitudinal direction of the sealing member.

Also, an eleventh aspect of the semiconductor device according to the invention is such that the power semiconductor chip is configured of a voltage controlling semiconductor element having a gate electrode and a current detecting auxiliary electrode, and of wiring patterns formed on the printed circuit board, a wiring pattern connected to the gate electrode is formed on one surface of the printed circuit board, and a wiring pattern connected to the current detecting auxiliary electrode is formed in a position on the other surface of the printed circuit board opposing the wiring pattern connected to the gate electrode.

The configuration may also be such that the main circuit component has a first semiconductor chip incorporating a semiconductor element and a second semiconductor chip incorporating a semiconductor rectifier element, the semiconductor element incorporated in the first semiconductor chip is configured of a voltage controlling semiconductor element having a gate electrode, and the gate electrode is disposed so as to be positioned on an end surface side on the side opposite to that of the end surface opposing the second semiconductor chip.

Also, a twelfth aspect of the semiconductor device according to the invention is such that the power semiconductor chip is configured of a voltage controlling semiconductor element having a main electrode, a wiring pattern member connected to the main electrode is formed on both the front and back surface of the printed circuit board, and the two wiring pattern members have the same potential.

Also, a thirteenth aspect of the semiconductor device according to the invention is such that the power semiconductor chip is configured of a voltage controlling semiconductor element having a gate electrode, and the power semiconductor chip is disposed so that the gate electrode is positioned on the outer side of the insulating substrate in a longitudinal direction when a plurality of the insulating substrates are disposed.

Also, a fourteenth aspect of a semiconductor device according to the invention includes a plurality of conductive pattern members, on each of which is mounted one or a plurality of power semiconductor chips; and a printed circuit board wherein a chip rod-form conductive connection member connected to the power semiconductor chip and a pattern rod-form conductive connection member connected to the conductive pattern member are disposed on the surface opposing the conductive pattern member. Further, a wiring pattern of the printed circuit board is disposed so that the signs of the change rate of current flowing through the conductive pattern member and the change rate of current flowing through the printed circuit board opposing the conductive pattern member are positive and negative opposite signs.

Advantageous Effects of Invention

According to the invention, a conductor pattern formed on an insulating substrate is formed of a narrow portion, and of a wide portion on which a semiconductor chip is mounted, and a current path is formed between a plurality of main circuit component parts by the narrow portion of the conductive pattern and a printed circuit board being connected by a rod-form conductive connection member. Therefore, it is possible to provide a small semiconductor device such that it is possible to adopt a configuration wherein inductance is reduced without increasing the dimensions, and resin molding is easy, and it is thus possible to respond to a high speed switching element.

BRIEF DESCRIPTION OF THE DRAWINGS

FIGS. 1A and 1B are perspective views showing an embodiment of a semiconductor device according to the invention, wherein FIG. 1A is a perspective view seen from a planar surface side, while FIG. 1B is a perspective view seen from a bottom surface side.

FIGS. 4A, 4B and 4C are diagrams showing an insulating substrate applicable to the invention, wherein FIG. 4A is a plan view, FIG. 4B is a side view, and FIG. 4C is a bottom view.

FIGS. 5A and 5B are diagrams showing a printed circuit board applicable to the invention, wherein FIG. 5A is a plan view and FIG. 5B is a bottom view.

FIG. 10 is a plan view showing an existing resin sealing die.

FIGS. 11A, 11B and 11C are diagrams showing a first modification example of an insulating substrate, wherein FIG. 11A is a plan view, FIG. 11B is a side view, and FIG. 11C is a bottom view.

FIGS. 12A, 12B and 12C are diagrams showing a second modification example of an insulating substrate, wherein FIG. 12A is a plan view, FIG. 12B is a side view, and FIG. 12C is a bottom view.

DETAILED DESCRIPTION

Figure 1A:
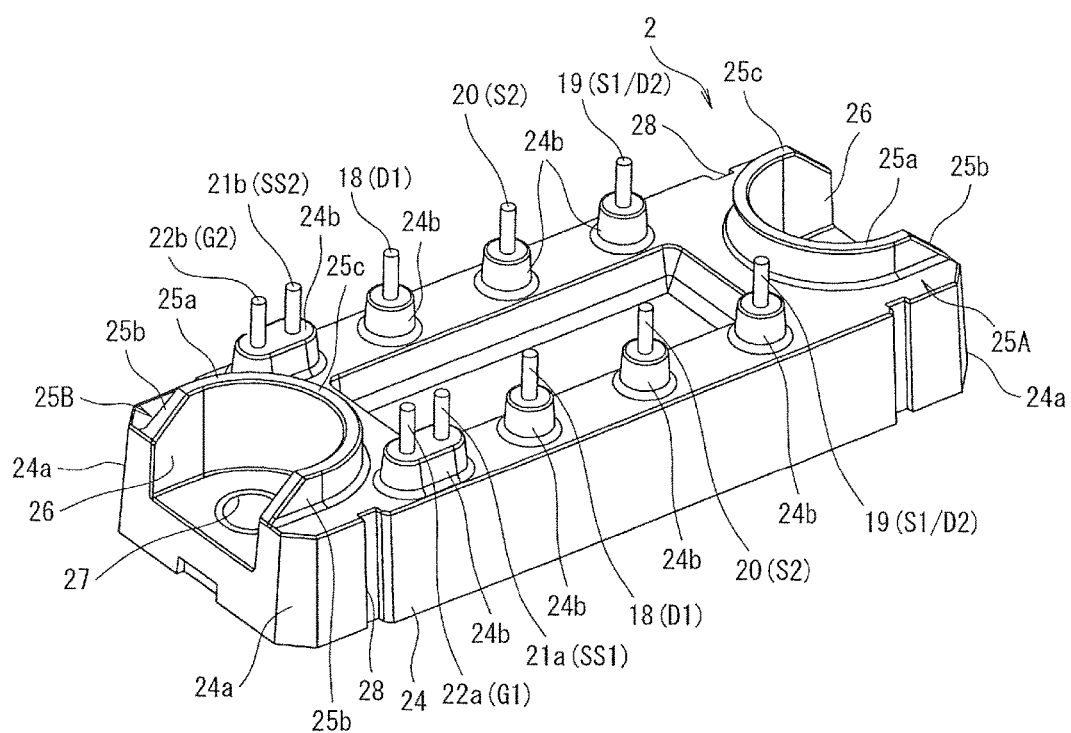

Hereafter, referring to the drawings, a description will be given of an embodiment of the invention.

Figure 1B:
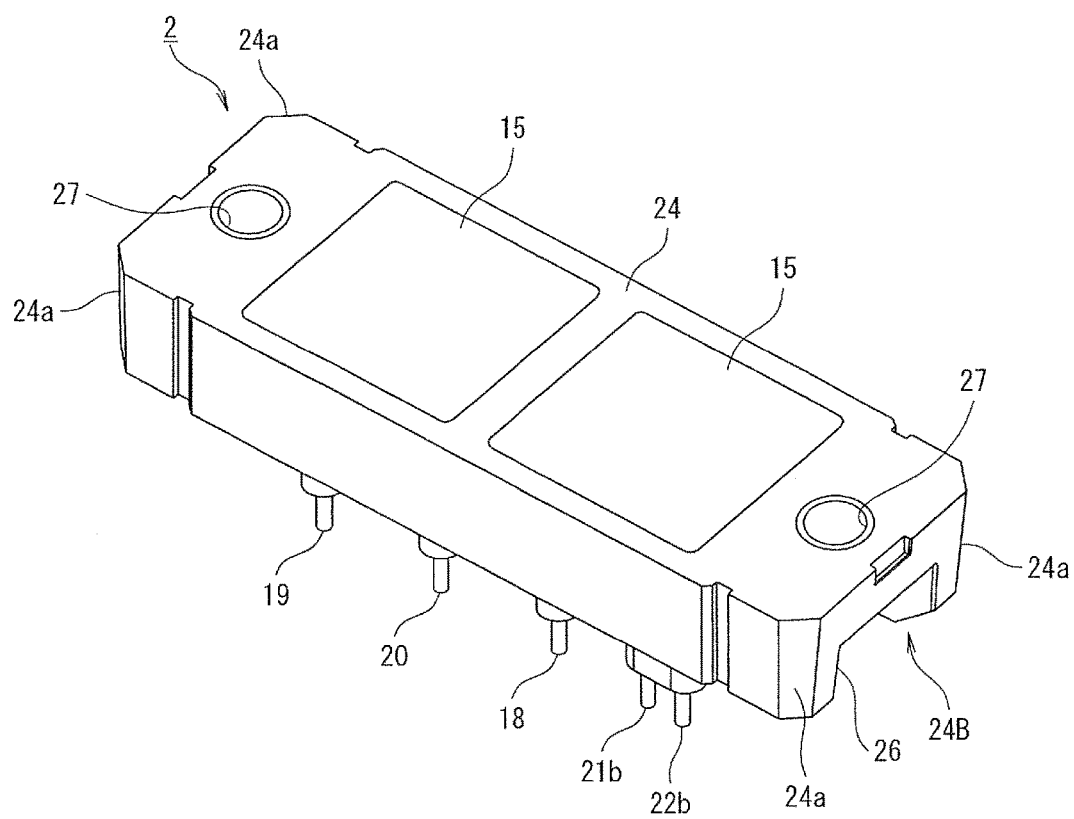

FIGS. 1A and 1B are perspective views showing a semiconductor device according to the invention.

In the drawing, 2 is a power semiconductor module acting as a semiconductor device. The power semiconductor module 2 includes, as is particularly clear in FIG. 2 to FIG. 8, a pair of main circuit components 13A and 13B, including a first semiconductor chip 12A and a second semiconductor chip 12B, mounted on insulating substrates 11A and 11B respectively, and a printed circuit board 16 configuring a common wiring circuit above the main circuit components 13A and 13B.

The first semiconductor chip 12A is configured incorporating a power MOSFET (Metal-Oxide-Semiconductor Field-Effect Transistor) (or an insulated gate bipolar transistor (IGBT)). The second semiconductor chip 12B is configured incorporating a free wheeling diode (FWD).

Figure 2:
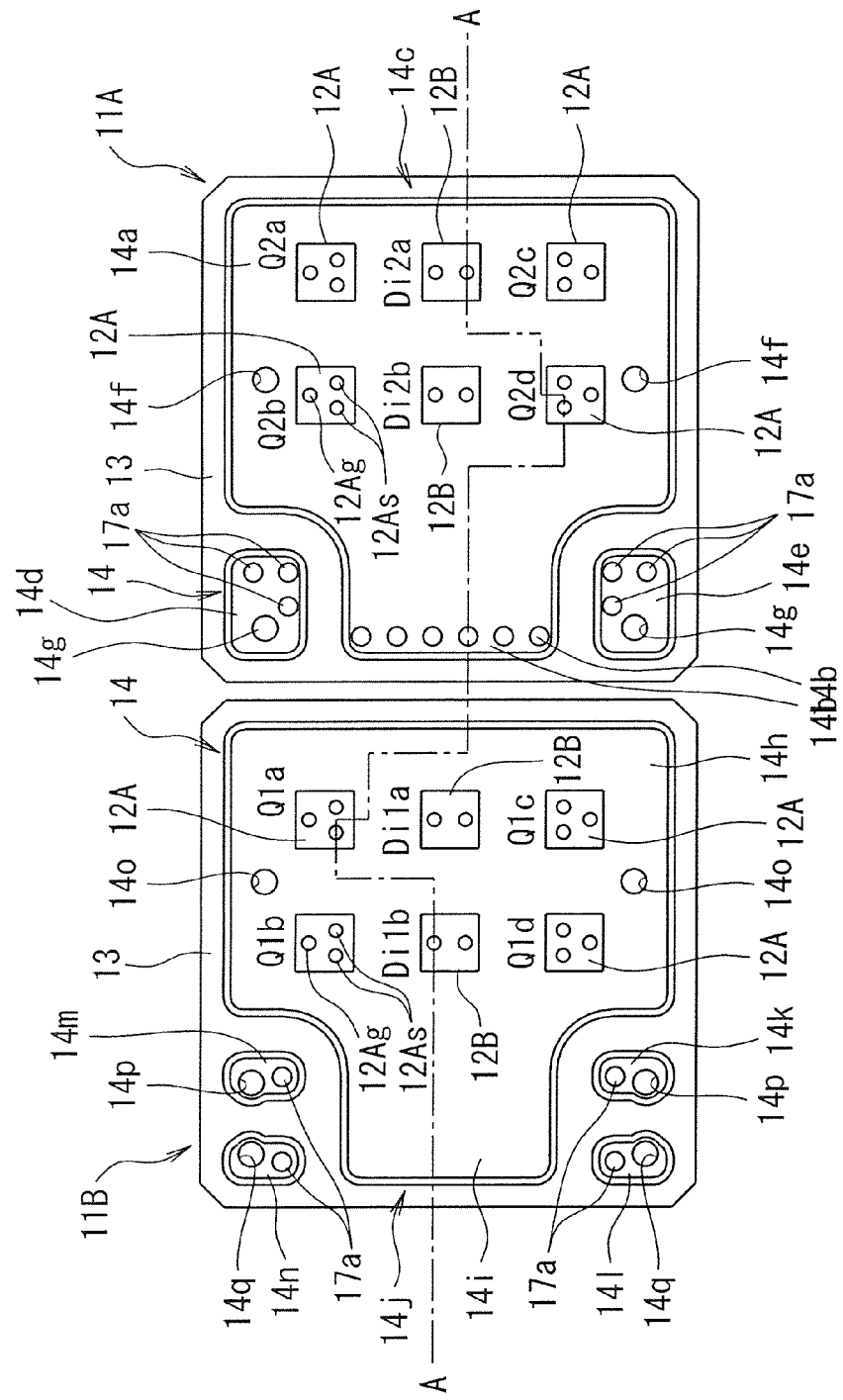
FIG. 2 is a plan view of an insulating substrate on which a semiconductor chip is mounted.

Further, as shown in FIG. 2, two of the second semiconductor chip 12B are disposed maintaining a predetermined interval on a longitudinal direction (a left-right direction in the drawing) central line on the insulating substrate 11A, and two each of the first semiconductor chip 12A are disposed maintaining a predetermined distance on either outer side of the second semiconductor chips 12B. Two of the second semiconductor chips 12B, and four of the first semiconductor chips 12A sandwiching the second semiconductor chips 12B, are disposed in the same way on the insulating substrate 11B too.

Herein, the first semiconductor chip 12A has a drain electrode 12Ad, a source electrode 12As, and a gate electrode 12Ag, wherein the gate electrode 12Ag is disposed so as be on an end portion side (insulating substrate outer side) on the side opposite to that of the second semiconductor chip 12B.

Although the semiconductor chips 12A and 12B are the heretofore described kinds of power device, they may be formed on a silicon substrate, or may be formed on a SiC or other substrate.

The insulating substrate 11A has a substrate 13 of, for example, a square form with a ceramic such as alumina, with good heat conductivity, as a main component, a conductive pattern 14 acting as a conductive pattern member configured of a copper plate with a thickness of 0.5 mm or more is bonded to the front surface of the substrate 13, and a heat releasing heat transferring pattern 15 having the same thickness is bonded to the back surface of the substrate 13.

Figure 3:
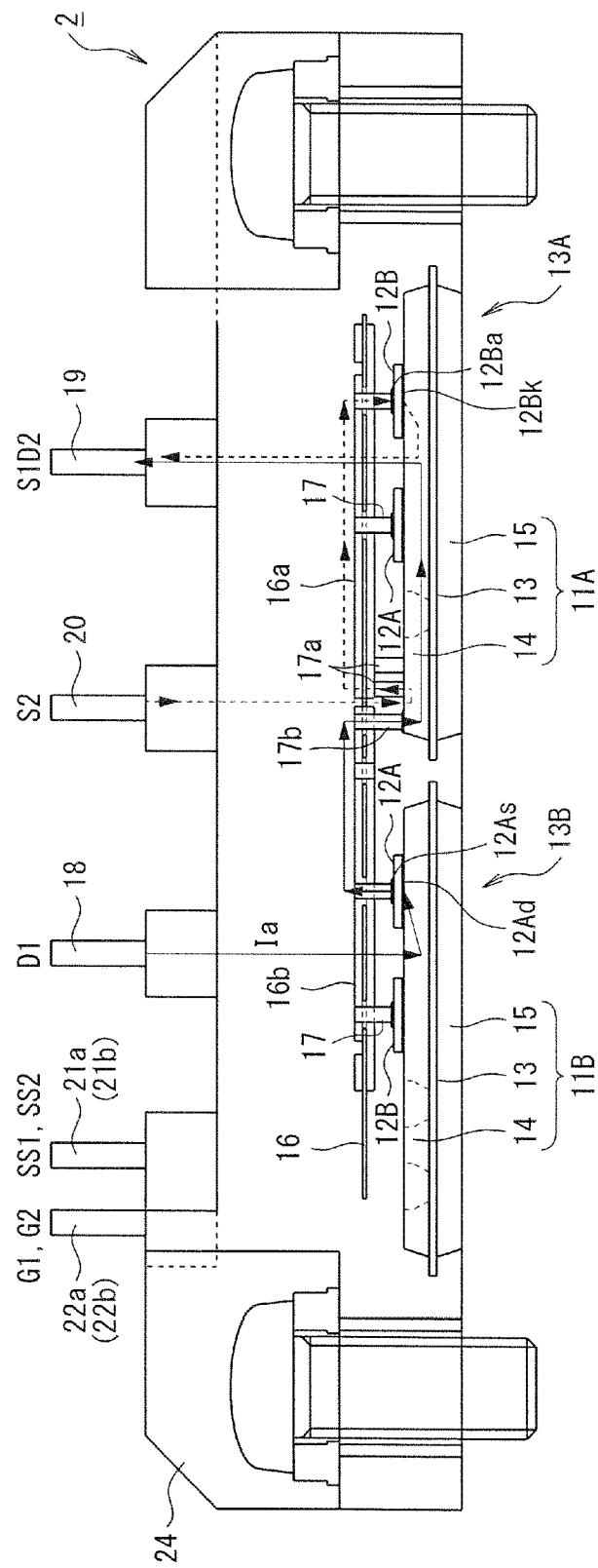
FIG. 3 is a sectional view of the semiconductor device of FIGS. 1A and 1B along a line A-A of FIG. 2.
Figure 4A:
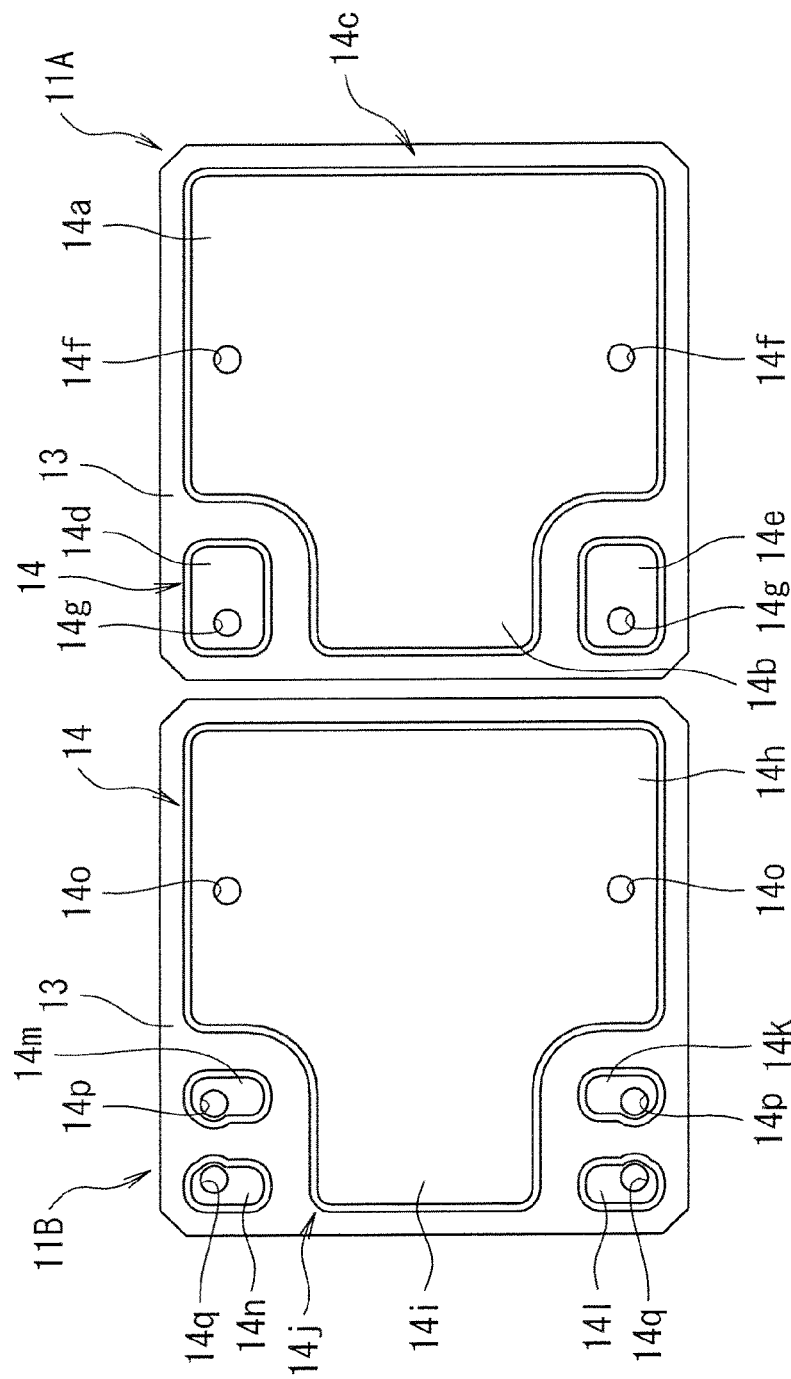
Figure 4B:
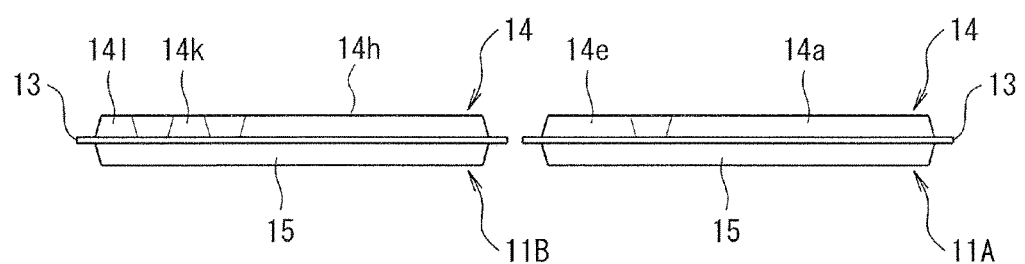
Figure 4C:
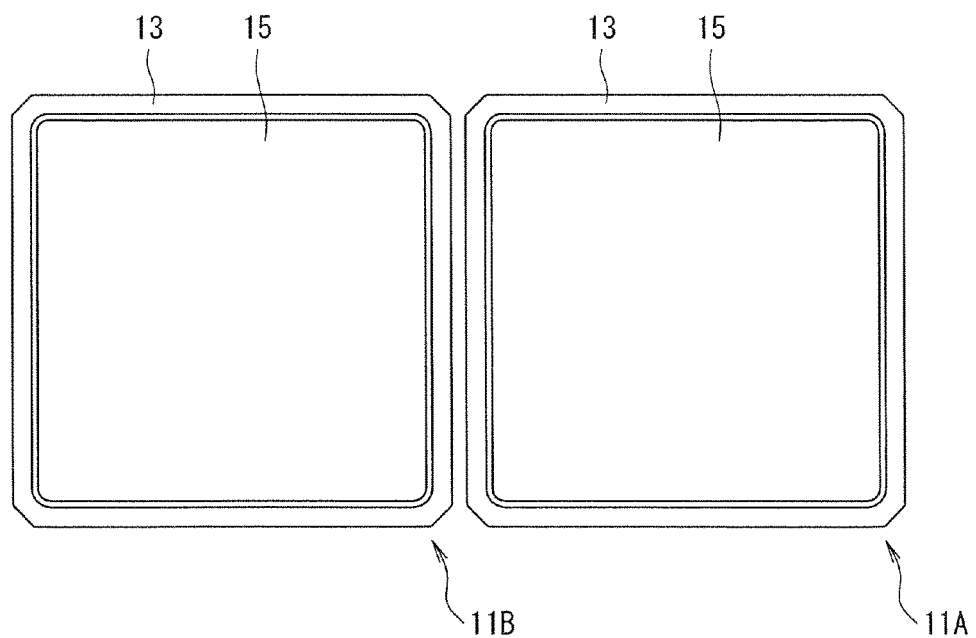

The conductive pattern 14, as shown in FIG. 2 and FIG. 3, has a chip mounting pattern 14c, the planar form of which is a protruding (T) form. The chip mounting pattern 14c includes a wide portion 14a, of which an end portion on the right side in the drawing has a width practically equal to the width of the substrate 13, and a narrow portion 14b, contiguous with the left side of the wide portion 14a, of a width smaller than that of the wide portion 14a.

Also, the conductive pattern 14 has independent terminal connection patterns 14d and 14e maintaining a predetermined interval on the outer side of the narrow portion 14b of the chip mounting pattern 14c. Side edges of the terminal connection patterns 14d and 14e coincide with side edges of the wide portion 14a of the chip mounting pattern 14c.

Herein, as shown in FIG. 2, the first semiconductor chip 12A and second semiconductor chip 12B are mounted across a joining member such as solder on the wide portion 14a of the chip mounting pattern 14c, and two fitting holes 14f are formed on the width direction outer sides of the first semiconductor chip 12A. A conductive terminal pin 19 forming a main circuit external connection terminal is press fitted into the fitting hole 14f. Also, a fitting hole 14g is formed in each of the terminal connection patterns 14d and 14e. A conductive terminal pin 20 forming a source terminal S2 that acts as an external connection terminal is press fitted into the fitting hole 14g.

Also, in the same way as the insulating substrate 11A, the insulating substrate 11B also has the substrate 13 with a ceramic as a main component, and the conductive pattern 14 and heat releasing heat transferring pattern 15 formed on the front and back of the substrate 13. The conductive pattern 14 has a chip mounting pattern 14j, the planar form of which is a protruding (T) form. The chip mounting pattern 14j, in the same way as on the insulating substrate 11A, includes a wide portion 14h and a narrow portion 14i. Pairs of terminal connection patterns 14k, 14l and 14m, 14n are independently formed maintaining a predetermined interval on the outer side of the narrow portion 14i of the chip mounting pattern 14j.

Further, as shown in FIG. 2, the first semiconductor chip 12A and second semiconductor chip 12B are mounted across a joining member such as solder on the chip mounting pattern 14j, and two fitting holes 14o are formed on the width direction outer sides of the first semiconductor chip 12A. A conductive terminal pin 18 forming a drain terminal that acts as an external connection terminal is press fitted into the fitting hole 14o. A fitting hole 14p is formed in each of the terminal connection patterns 14k and 14m. Conductive terminal pins 21a and 21b forming source auxiliary terminals that act as external connection terminals are press fitted into the fitting holes 14p. A fitting hole 14q is formed in each of the terminal connection patterns 14l and 14n. Conductive terminal pins 22a and 22b forming gate terminals that act as external connection terminals are press fitted into the fitting holes 14q.

Herein, it is desirable that the material of the conductive terminal pins 18, 20, and 19 is copper (Cu) or of an aluminum (Al) series, which have excellent conductivity. However, when considering ease of solder joining, mounting efficiency can be increased by carrying out surface treatment on the conductive terminal pins 18, 20, and 19 using nickel (Ni) or a tin series, thereby improving the leakage of the solder joint.

Figure 6:
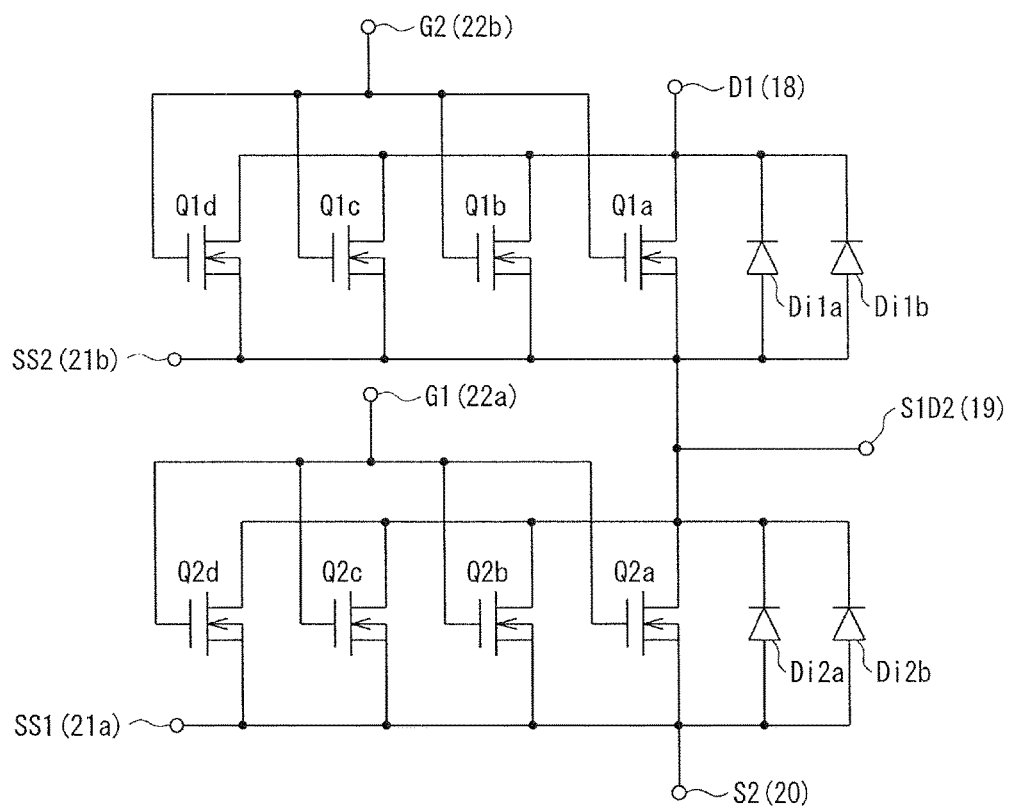
FIG. 6 is a circuit diagram showing an equivalent circuit of the semiconductor device.

As is clear from the equivalent circuit diagram shown in FIG. 6, an anti-parallel connection circuit including, for example, N-channel MOSFETs (hereafter referred to simply as transistors) Q1a to Q1d forming the first semiconductor chips 12A and FWDs (hereafter referred to as diodes) Di1a and Di1b forming the second semiconductor chips 12B, which configure an upper arm, are formed on the conductive pattern 14 of the insulating substrate 11B. An anti-parallel circuit including transistors Q2a to Q2d forming the first semiconductor chips 12A and diodes Di2a and Di2b forming the second semiconductor chips 12B, which configure a lower arm, are formed on the conductive pattern 14 of the insulating substrate 11A. The two anti-parallel circuits are connected in series.

Herein, as it is sufficient that the semiconductor chips (power devices) disposed on one of the insulating substrates 11A and 11B are such that the anti-parallel circuits of transistors and diodes shown in FIG. 6 are configured equivalently, there may be one each of the transistors and diodes, or there may be the same multiple of both.

Further, the two anti-parallel circuits formed of one pair of the transistors Q1a to Q1d and Q2a to Q2d and the diodes Di1a, Di1b, Di2a, and Di2b are connected in series to the printed circuit board 16 disposed in an upper plane via a cylindrical post electrode 17 acting as a rod-form conductive connection member.

As shown in FIG. 2, the two semiconductor chips 12A and 12B can be disposed aligned in a left-right direction instead of being disposed aligned in a front-back direction.

Further, a drain electrode 12Ad of the transistors Q1a to Q1d (or Q2a to Q2d) is formed on the lower surface of the first semiconductor chip 12A, and is connected via the chip mounting pattern 14j (or 14c) of the conductive pattern 14 to the conductive terminal pin 18 acting as a connection terminal configuring an external input terminal (drain terminal D1) (or to the conductive terminal pin 19 forming a main circuit external connection terminal (source/drain terminal S1/D2)) of the power semiconductor module 2. A cathode electrode formed on the back surface of the second semiconductor chip 12B is also connected via the chip mounting pattern 14*j* (or 14*c*) to the conductive terminal pin 18 (or conductive terminal pin 19).

Also, the source electrode 12A*s* and gate electrode 12A*g* of the transistors Q1*a* to Q1*d* (or Q2*a* to Q2*d*) are formed on the front surface of the first semiconductor chip 12A, and each is connected to the printed circuit board 16 via the post electrode 17 acting as a chip rod-form conductive connection member.

Herein, although the source electrode 12A*s* and gate electrode 12A*g* of the transistors Q1*a* to Q1*d* (or Q2*a* to Q2*d*) are connected to the wiring pattern formed on the printed circuit board 16, the wiring pattern connected to a gate electrode is formed on one surface of the printed circuit board 16, while the wiring pattern connected to a source sense electrode (not shown) is formed in a position on the other surface of the printed circuit board 16 opposing the wiring pattern connected to the gate electrode.

By disposing the wiring pattern connected to the gate electrode and the wiring pattern connected to the source sense electrode in this way, it is possible to reduce the mutual inductance between the two wiring patterns. By reducing the mutual inductance, it is possible to stabilize control of the transistors Q1*a* to Q1*d* (or Q2*a* to Q2*d*). In particular, reducing the mutual inductance is effective in restricting false firing caused by the effect of wiring inductance.

Also, an anode electrode is formed on the front surface of the second semiconductor chip 12B, and the anode electrode is connected to the printed circuit board 16 via the post electrode 17 acting as a chip rod-form conductive connection member.

As shown in FIGS. 1A and 1B, the conductive terminal pins 18 to 20 are formed one each in positions symmetrical across a width direction central line of the power semiconductor module 2. Also, the power semiconductor module 2 further has a total of four conductive terminal pins 21*a*, 21*b*, 22*a*, and 22*b*, two on each side on the longitudinal direction outer side of the conductive terminal pin 18. The conductive terminal pins 18 to 20 and 21*a*, 21*b*, 22*a*, and 22*b* are disposed in two rows in a practically straight line along the two side edges of the power semiconductor module 2.

The conductive terminal pins 21*a* and 21*b* are source auxiliary terminals and configure current detecting terminals SS1 and SS2, which are connected to the printed circuit board 16, connected to sources that sense current flowing between the drain and source of the transistors Q1*a* to Q1*d* and Q2*a* to Q2*d*, and output sense signals. Also, the remaining two conductive terminal pins 22*a* and 22*b* configure gate terminals G1 and G2, which are connected to the printed circuit board 16 and supply gate control signals to the gate electrodes of the half-bridge circuit transistors Q1*a* to Q1*d* and Q2*a* to Q2*d*.

Also, the heat releasing heat transferring pattern 15 on the back surface side of the insulating substrates 11A and 11B is configured by bonding a copper plate, in the same way as the conductive pattern 14, and the lower surface of the heat releasing heat transferring pattern 15 is flush with the bottom surface of the power semiconductor module 2, or protrudes slightly from the bottom surface.

Figure 5A:
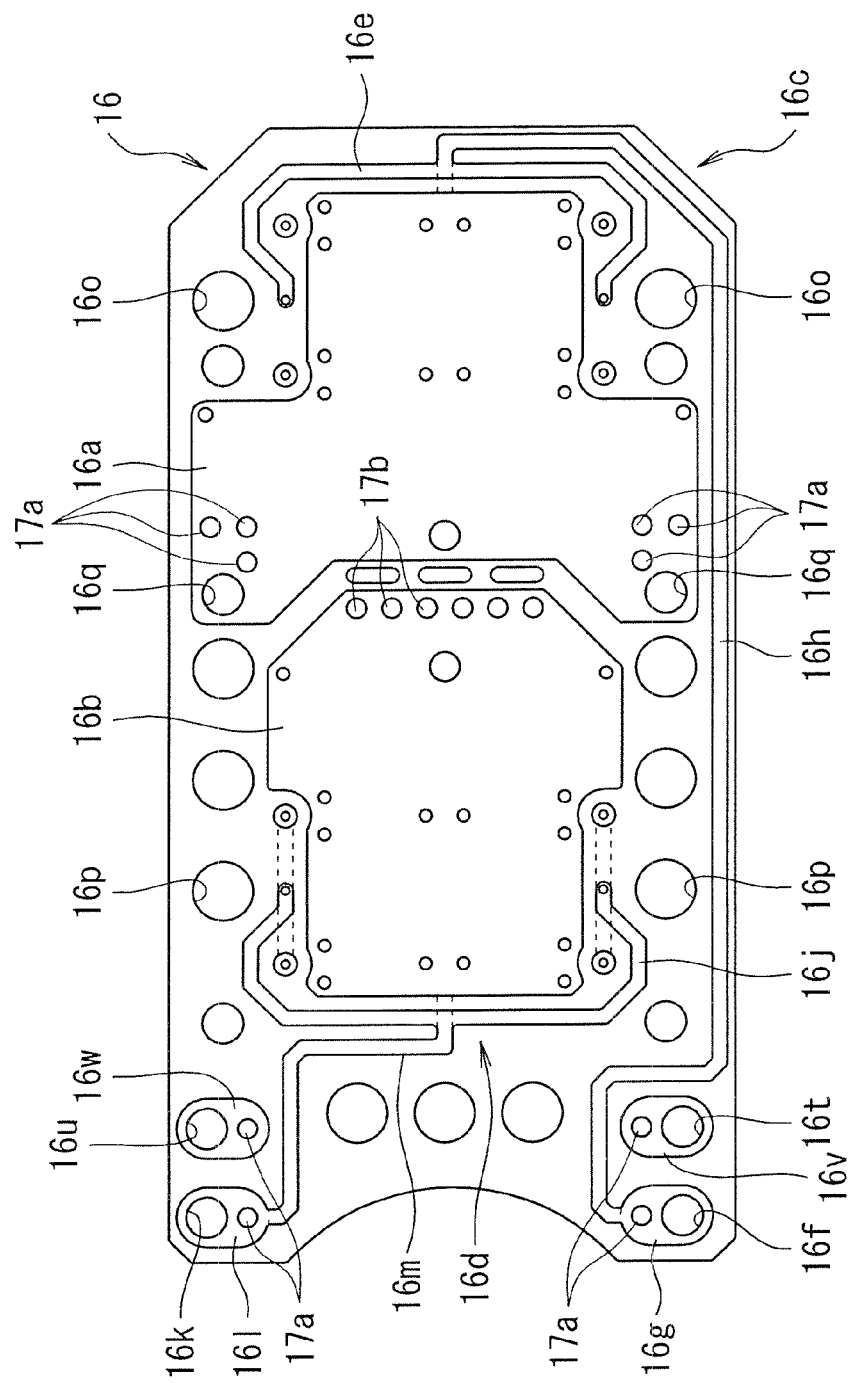
Figure 5B:
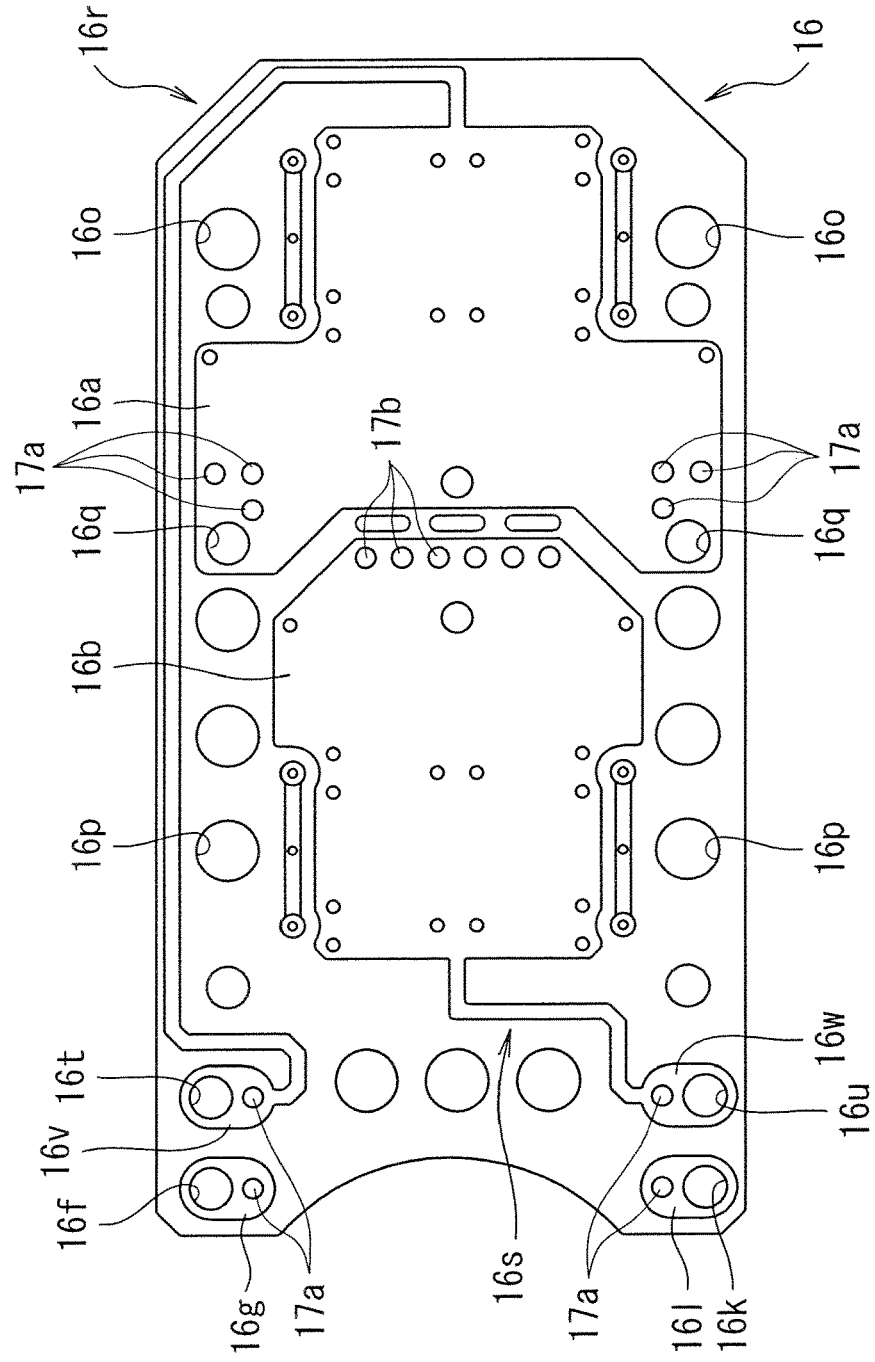

As shown in FIGS. 5A and 5B, the printed circuit board 16 is such that a wide main circuit wiring pattern 16*a* of a T-form whose stem faces right, which forms a circuit path of the main circuit component 13A, and a similarly wide main circuit wiring pattern 16*b*, which forms a circuit path of the main circuit component 13B, are formed on the front surface side. Also, gate wiring patterns 16*c* and 16*d* connected via the post electrode 17 to the gate electrodes of the first semiconductor chips 12A of the main circuit components 13A and 13B are formed on the front surface of the printed circuit board 16.

The gate wiring pattern 16*c* is configured of a crown-form pattern 16*e* and a connection pattern 16*h*. The crown-form pattern 16*e* is formed so as to enclose the narrow portion of the T-form wiring pattern 16*a*, maintaining a predetermined distance. The connection pattern 16*h* is extended along a side edge of the printed circuit board 16 so as to link a central portion of the crown-form pattern 16*e* and a terminal connection pattern 16*g*. The terminal connection pattern 16*g* is formed on the periphery of an insertion hole 16*f*, pierced in a left end portion of the printed circuit board 16, for inserting the conductive terminal pin 22*a*.

The gate wiring pattern 16*d* is configured of a crown-form pattern 16*j* and a connection pattern 16*m*. The crown-form pattern 16*j* is formed so as to enclose a left side end portion of the wiring pattern 16*b*. The connection pattern 16*m* is formed in an approximate L-form so as to link a central portion of the crown-form pattern 16*j* and a terminal connection pattern 16*l*. The terminal connection pattern 16*l* is formed on the periphery of an insertion hole 16*k*, pierced in a left end portion of the printed circuit board 16, for inserting the conductive terminal pin 22*b*.

Simple insertion holes 16*o* and 16*p*, through which the conductive terminal pins 18 and 19 are inserted contactlessly, and a through hole 16*q*, through which the conductive terminal pin 20 is inserted contactlessly, are pierced in the printed circuit board 16.

Herein, it is taken that the through hole 16*q* is not in contact with the conductive terminal pin 20, but when further inductance reduction is necessary, the wiring length can be reduced by the through hole 16*q* and conductive terminal pin 20 being electrically connected by soldering or the like.

Furthermore, as shown in FIG. 5B, the wide main circuit wiring pattern 16*a* of a T-form whose stem faces right, which forms a circuit path of the main circuit component 13A, and 16*b* are formed on the back surface of the printed circuit board 16 so as to coincide with the front surface side main circuit wiring patterns 16*a* and 16*b* when seen in plan view. Also, source sense terminal wiring patterns 16*r* and 16*s*, connected via the post electrode 17 to an anode of the diode Di1*a* of the main circuit component 13A and an anode of the diode Di2*a* of the main circuit component 13B, are formed on the back surface of the printed circuit board 16. The source sense terminal wiring patterns 16*r* and 16*s* are formed so as to largely coincide with the front side gate wiring patterns 16*c* and 16*d* when seen in plan view, and are connected to terminal connection patterns 16*v* and 16*w*, formed on the periphery of insertion holes 16*t* and 16*u* for inserting the conductive terminal pins 21*a* and 21*b*, on the left end of the printed circuit board 16.

Herein, an end portion on the main circuit wiring pattern 16*a* side of the main circuit wiring pattern 16*b* on the front and back of the printed circuit board 16 is electrically connected to the narrow portion 14*b* of the chip mounting pattern 14*c* of the insulating substrate 11A by a plurality, for example six, of a post electrode 17*b* acting as pattern rod-form conductive connection members, whereby a current path is formed by the post electrodes 17*b* between the main circuit components 13A and 13B. As shown in the drawing, an end portion on the right side of the main circuit wiring pattern 16*b* in which the post electrodes 17*b* are provided is disposed in a cutaway portion on the left side of the main circuit wiring pattern 16*a*, whereby it is possible to reduce the size of the semiconductor device while maintaining the area over which the main circuit wiring pattern 16a and chip mounting pattern 14c coincide, which is desirable.

Also, the main circuit wiring patterns 16a on the front and back of the printed circuit board 16 are set to have the same potential as each other, and in the same way, the front and back wiring patterns 16b are also set to have the same potential as each other.

Figure 8:
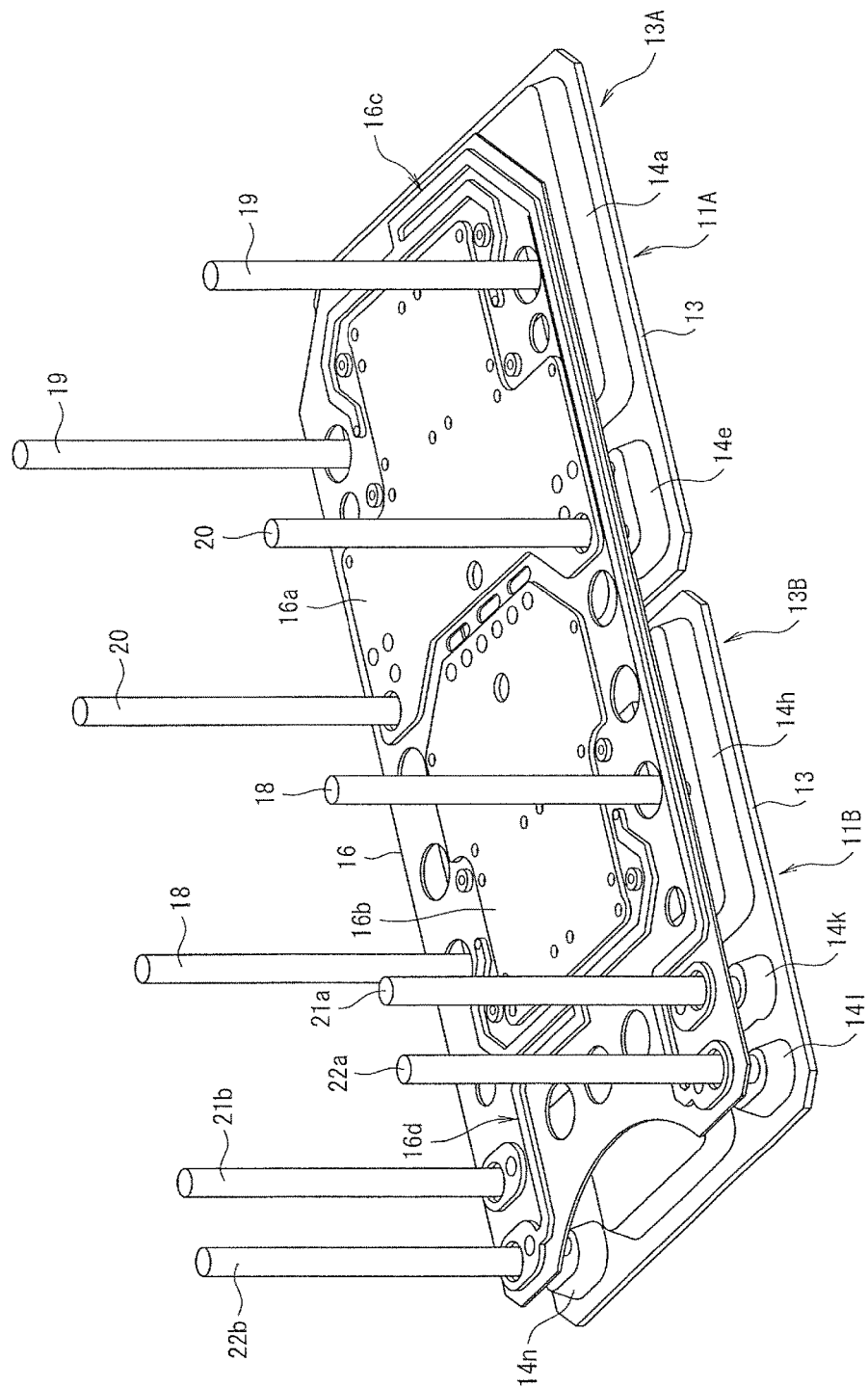
FIG. 8 is a perspective view showing a state wherein the printed circuit board is mounted on the insulating substrate.

Further, in a state wherein the conductive terminal pins 18 to 20, 21a, 21b, 22a, and 22b are press fitted into the main circuit components 13A and 13B and held vertically, the main circuit components 13A and 13B and the printed circuit board 16 are joined, as shown in FIG. 8. In this case, the conductive terminal pins 19, 18, 20, 21a, 21b, 22a, and 22b are inserted respectively through the insertion holes 16o, 16p, 16q, 16t, 16u, 16f, and 16k pierced in the printed circuit board 16.

Also, the post electrodes 17 forming chip rod-form conductive connection members formed in the printed circuit board 16 are brought into contact across solder with the first semiconductor chip 12A and second semiconductor chip 12B, while the post electrodes 17b forming pattern conductive connection members are brought into contact across solder with the conductor pattern 14a of the insulating substrate 11A. By a reflow process being carried out in this state, the post electrodes 17 and post electrodes 17b of the printed circuit board 16 are electrically and mechanically joined to the first semiconductor chip 12A and second semiconductor chip 12B, and to the conductive pattern 14.

Simultaneously with this, the main circuit wiring pattern 16a of the printed circuit board 16 is electrically joined to the terminal connection patterns 14d and 14e of the insulating substrate 11A via post electrodes 17a acting as pattern rod-form conductive connection members. Also, the terminal connection patterns 16g and 16l of the printed circuit board 16 are electrically connected to the terminal connection patterns 14l and 14n of the insulating substrate 11A via, in the same way, post electrodes 17a. Furthermore, the terminal connection patterns 16v and 16w of the printed circuit board 16 are electrically joined to the terminal connection patterns 14k and 14m of the insulating substrate 11A via, in the same way, post electrodes 17a.

Figure 9:
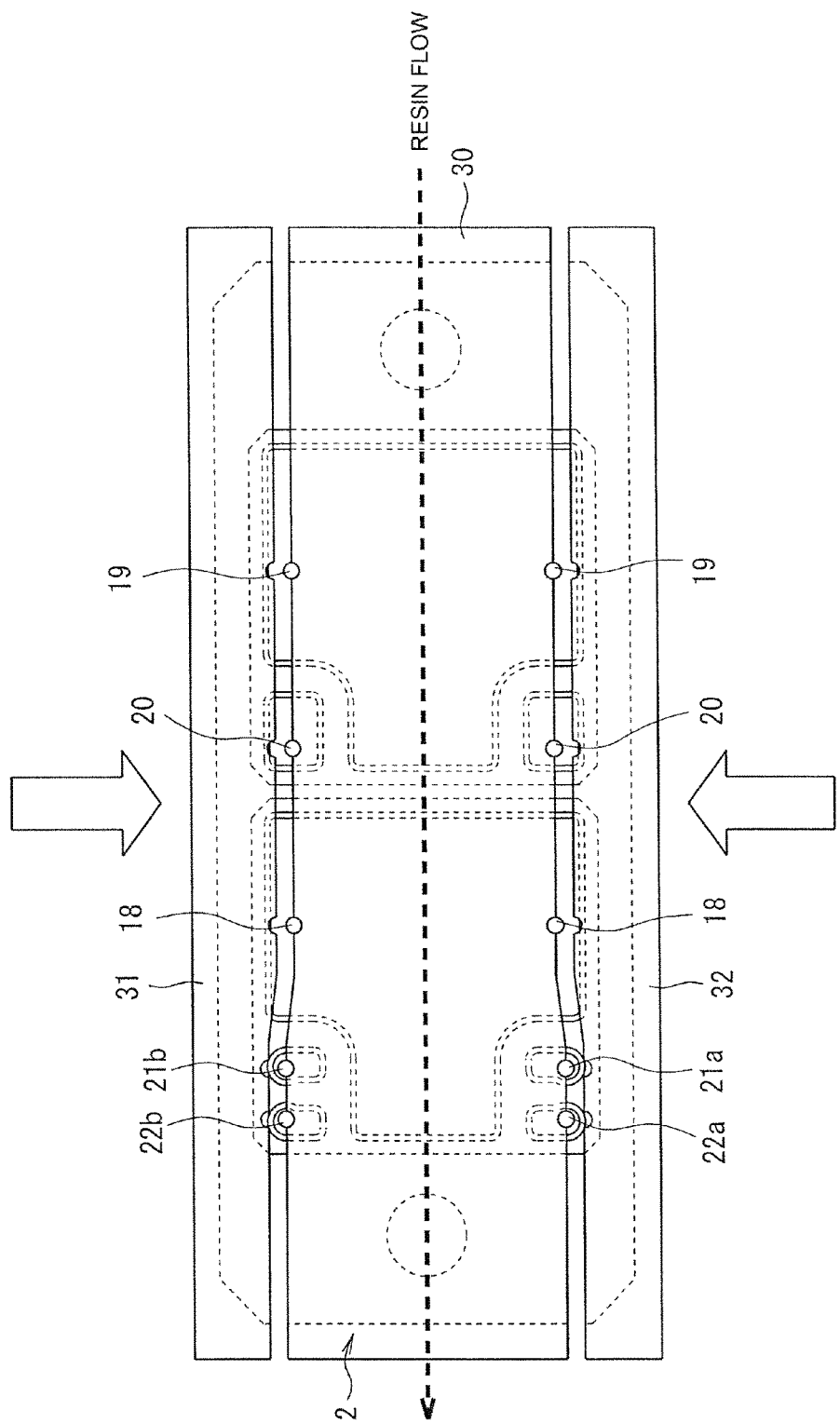
FIG. 9 is a plan view showing a resin sealing die applicable to the invention.

After the main circuit components 13A and 13B and the printed circuit board 16 are joined in this way, the inner sides of the conductive terminal pins 18 to 20, 21a, 21b, 22a, and 22b are fixed to a supporting fixed die 30 and, in a state wherein sliding dies 31 and 32 are brought into contact with front and back end portions of the fixed die 30, as shown in FIG. 9, an epoxy resin material of, for example, thermosetting resin is injected from, for example, the right end side of the fixed die 30, whereby the resin flows in the resin flow direction indicated by an arrow in FIG. 9, and molding is carried out. At this time, as the conductive terminal pins 18 to 20, 21a, 21b, 22a, and 22b are disposed in the resin flow direction, there is no impediment to the resin flow, and it is possible to smoothly prevent the occurrence of a void, thus improving adhesion.

By molding being carried out in this way, the outline of the power semiconductor module 2 is formed overall as a cuboid molded body (sealing resin member) 24 forming a rectangular form in plan view, as shown in FIGS. 1A and 1B.

Further, insulating wall portions 25A and 25B are formed in the molded body 24 at either end portion side in the longitudinal direction thereof, as shown in FIGS. 1A and 1B. The insulating wall portions 25A and 25B are formed of a U-form protruding portion 25c, which is formed of a semi-cylindrical protruding portion 25a of a comparatively large diameter formed inwardly from the longitudinal direction end face of the molded body 24, and protruding from the surface thereof, and side wall portions 25b extending in a tangential direction from either end face of the semi-cylindrical protruding portion 25a to the end face of the molded body 24, and a depressed portion 26, which is contiguous with the inner peripheral surface of the U-form protruding portion 25c and hollowed out to a thickness approximately half that of the molded body 24, and the end face side thereof is opened.

An attachment hole 27 centered on, for example, the central axis of the semi-cylindrical protruding portion 25a is formed penetrating to the bottom surface of the molded body 24 in a bottom portion of the depressed portion 26 configuring the insulating wall portions 25A and 25B. Herein, the inner diameter of the semi-cylindrical protruding portion 25a of the insulating wall portions 25A and 25B is set to be a diameter larger than the head portions of fixtures such as an attachment bolt and attachment screw inserted through the attachment hole 27, and the semi-cylindrical protruding portion 25a is set to have a wall face height such that the necessary creepage distance between the neighboring conductive terminal pins 18, 22a, and 22b and the head portions of the fixtures can be sufficiently secured.

Further, in a state wherein a required number of the power semiconductor module 2 having the heretofore described configuration are disposed in parallel, the conductive terminal pins 18 to 20 are individually connected to a main terminal bar, and the conductive terminal pins 21a, 21b, 22a, and 22b are connected via wire or printed wiring to a drive circuit, whereby it is possible to form, for example, a U-phase of an inverter circuit, and by three of this configuration being combined, it is possible to form a U-phase, a V-phase, and a W-phase.

When configuring, for example, an inverter device in this way, the transistors Q1a to Q1d and Q2a to Q2d of the main circuit components 13A and 13B installed in the power semiconductor module 2 are alternately controlled so as to be turned on and off so that when one group is in an on-state, the other group is in an off-state.

Therefore, the power semiconductor module 2 is such that, when taking the transistors Q1a to Q1d to be in an on-state and the transistors Q2a to Q2d to be in an off-state, a large current Ia input from the conductive terminal pin 18 forming the drain terminal D1 is supplied to the drain electrode 12Ad of the transistors Q1a to Q1d via the conductive pattern 14 of the main circuit component 13B, as indicated by the solid arrow in FIG. 3.

Current output from the source electrode 12As of the transistors Q1a to Q1d passes through the main circuit wiring pattern 16b of the printed circuit board 16 via the post electrode 17, and is supplied via the post electrode 17b to the conductive pattern 14 of the main circuit component 13A.

The current supplied to the conductive pattern 14 of the main circuit component 13A is output via the conductive terminal pin 19 to an inductive load as, for example, a U-phase output.

At this time, the transistors Q2a to Q2d of the main circuit component 13A are maintained in an off-state, because of which no output current is obtained at the source terminal S2, and the conductive terminal pin 20 is maintained in a current cutoff state.

Figure 7:
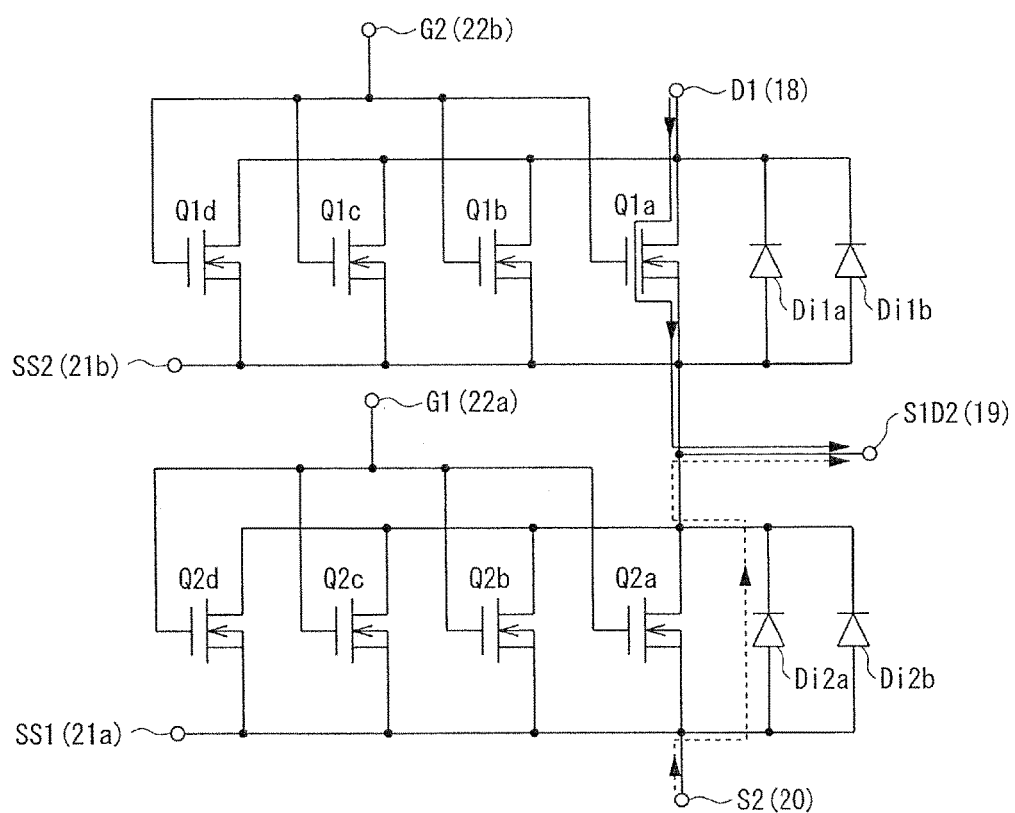
FIG. 7 is a circuit diagram showing a current path when a transistor Q1a of FIG. 6 is inverted from an on-state to an off-state.

When expressing the heretofore described current path as an equivalent circuit with the transistors Q1a to Q1d represented by the transistor Q1a, current input from the drain terminal D1 (the conductive terminal pin 18) is output from the drain of the transistor Q1a through the source to the S1D2 terminal (the conductive terminal pin 19) forming an output terminal, as indicated by a solid line in FIG. 7.

When the transistors Q1a to Q1d of the main circuit component 13B switch from this state to an off-state, the current Ia shown by solid lines in FIG. 3 and FIG. 7 decreases, but owing to the effect of the inductive load, the output current of the S1D2 terminal (the conductive terminal pin 19) forming an output terminal continues. The shortfall is compensated for by a supply from the source terminal S2 (the conductive terminal pin 20) via the free wheeling diodes Di2a and Di2b of the main circuit component 13A, as indicated by the dotted line in FIG. 7.

When expressing this current path in FIG. 3, current input from the conductive terminal pin 20 (the source terminal S2) is supplied from the terminal connection patterns 14d and 14e in the conductive pattern 14 of the insulating substrate 11A via the post electrode 17a to the main circuit wiring pattern 16a of the printed circuit board 16, as indicated by the dotted line.

Current supplied to the main circuit wiring pattern 16a is supplied via the post electrode 17 from an anode 12Ba of the free wheeling diode Di2a (the semiconductor chip 12B), through a cathode 12Bk, to the conductor pattern 14a in the conductive pattern 14 of the insulating substrate 11A.

Current supplied to the conductor pattern 14a is supplied through the conductive terminal pin 19 (the output terminal S1D2) to the inductive load.

At this time, current passing through the transistor Q1a decreases while current passing through the free wheeling diode Di2a increases, the currents pass through the mutually opposing conductor patterns 14a and 14b of the insulating substrate 11A and through the main circuit wiring pattern 16a of the printed circuit board 16, eventually come together in the conductive terminal pin 19, and are output to the inductive load.

Therefore, the current indicated by the solid line decreases in the conductor pattern 14a of the main circuit component 13A, and the current change rate di/dt becomes, for example, negative, while the current passing through the main circuit wiring pattern 16a of the printed circuit board 16 indicated by the dotted line increases, and the current change rate di/dt becomes, for example, positive. Therefore, self inductance L1 of the conductive pattern 14 and self inductance L2 of the main circuit wiring pattern 16a of the printed circuit board 16 are connected in series and, taking the mutual inductance of the two to be M, an inter-terminal voltage v can be expressed by the following equation.

$$v=\{L1(di/dt)+M(di/dt)\}+\{L2(di/dt)+M(di/dt)\}$$

Consequently, as the current change rate di/dt of the conductor pattern 14a of the main circuit component 13A is negative, and the current change rate di/dt of the main circuit wiring pattern 16a of the printed circuit board 16 is positive, the mutual inductance M can be cancelled out.

Subsequently, after a predetermined dead time elapses, the transistors Q2a to Q2d switch to an on-state, while the transistors Q1a to Q1d continue to be in an off-state.

In this way, according to the embodiment, the current path between the main circuit component 13A, in which is mounted one group of the first semiconductor chip 12A and second semiconductor chip 12B, and the main circuit component 13B, in which is mounted the other group of the first semiconductor chip 12A and second semiconductor chip 12B, is formed from the first semiconductor chip 12A and second semiconductor chip 12B mounted on the conductor pattern 14 of the insulating substrate 11B, through the post electrode 17, via the main circuit wiring pattern 16b formed on the printed circuit board 16, and via the plurality of post electrodes 17b at an end portion on the main circuit wiring pattern 16a side, reaching the conductive pattern 14 (the chip mounting pattern 14c) of the insulating substrate 11A, as previously described. Therefore, it is possible to carry out an electrical connection of the conductive pattern 14 of the insulating substrate 11A and the printed circuit board 16 using the post electrodes 17b, possible to shorten the wiring distance and increase the sectional area of the current path, and thus possible to reduce the wiring inductance.

Moreover, by the signs of the current change rates (di/dt) of the currents flowing through the conductive pattern 14 of the main circuit component 13A and the main circuit wiring pattern 16a of the printed circuit board 16 being taken to be opposite signs, wherein one is positive and the other is negative, it is possible to reduce the mutual inductance M of the conductive pattern 14 of the main circuit component 13A and the main circuit wiring pattern 16a of the printed circuit board 16, and thus possible to ensure a high speed switching operation.

Furthermore, with the thickness of the conductive pattern 14 formed on the insulating substrates 11A and 11B of the main circuit components 13A and 13B being a copper pattern of 0.5 mm or more, 1.5 mm or less, the conductive terminal pins 18 to 20, 21a, 21b, 22a, and 22b forming external connection terminals are held by being press fitted. By the thickness of the conductive pattern 14 being 0.5 mm or more, the conductive terminal pins 18 to 20, 21a, 21b, 22a, and 22b are reliably held in the fitting holes 14o, 14f, 14g, 14p, and 14q respectively, and mounting of the conductive terminal pin 18 and the like can be carried out easily. At this time, by forming a plating layer to be melted by a reflow process on the inner peripheral surfaces of the fitting holes of the conductive pattern 14 in which the conductive terminal pins 18 to 20, 21a, 21b, 22a, and 22b are press fitted, holding of the conductive terminal pin 18 and the like can be carried out still more easily, and reliability increases commensurately.

The diameter of the conductive terminal pins 18 to 20, 21a, 21b, 22a, and 22b, being preferably in a range of 0.5 mm or more, 1.5 mm or less, is, for example, approximately 1.0 mm. When the diameter is less than 0.5 mm, inductance increases, and when the diameter is greater than 1.5 mm, soldering of the pins and other members is difficult. Also, the depth of the fitting holes 14o, 14f, 14g, 14p, and 14q is preferably within a range of 0.5 to 1.5 times the diameter of the conductive terminal pin 18 and the like, with the thickness of the conductive pattern 14 as the upper limit. Provided that the depth is within this range, the work of mounting the conductive terminal pin 18 and the like into the fitting hole 14o, and the like, formed in the conductive pattern 14 is easy.

Also, the thickness of the conductive pattern 14 is limited to 1.5 mm or less. The reason for this is that, when the thickness of the conductive pattern 14 exceeds 1.5 mm, becoming thick, etching for forming the conductive pattern 14 can no longer be carried out well due to side etching, and formation of an accurate pattern form becomes difficult.

Also, in order to prevent bending of the insulating substrates 11A and 11B due to thermal expansion, it is preferable that the thickness of the heat releasing heat transferring pattern 15 formed on the back surface side of the insulating substrates 11A and 11B is equal to the thickness of the conductive pattern 14. The thickness of the heat releasing heat transferring pattern 15 being less than 0.5 mm is undesirable from the aspect of cooling performance, and when the whole is sealed with a resin sealing member, as previously described, the thickness of the resin sealing member reaching the lower side of the substrate 13 decreases, and cracking is liable to occur in the resin sealing member, which is undesirable.

Moreover, the conductive pattern 14 formed on the insulating substrate 11A (or 11B) of the main circuit components 13A and 13B is such that the chip mounting pattern 14*c* (or 14*j*) on which the first semiconductor chip 12A and second semiconductor chip 12B are mounted is formed in a T-form of the wide portion 14*a* (or 14*h*) and narrow portion 14*b* (or 14*i*), and the terminal connection patterns 14*d* and 14*e* (or 14*k*, 14*l*, 14*m*, and 14*n*) are formed independently on either outer side sandwiching the narrow portion 14*b* (or 14*i*). Therefore, the size of the substrate 13 can be reduced, and the size of the power semiconductor module 2 itself can also be reduced commensurately.

Furthermore, as the insulating substrates 11A and 11B are provided individually in the main circuit components 13A and 13B, and the conductive pattern 14 and heat releasing heat transferring pattern 15 are formed on each of the insulating substrates 11A and 11B, as in the embodiment, it is possible to suppress temperature rise due to heat generation occurring in the first semiconductor chip 12A and internal stress caused by a difference in linear expansion coefficients, and thus possible to further increase the reliability of the power semiconductor module 2.

Further still, the pattern quantity of the conductive pattern 14 and heat releasing heat transferring pattern 15 formed on either surface of the substrate 13 of the main circuit components 13A and 13B can be such that the pattern quantity of the conductive pattern 14 is reduced, and the heat releasing heat transferring pattern 15 is disposed over practically the whole of the substrate 13. Therefore, the heat releasing area can be increased, and the heat releasing effect further increased. In this case, the narrow portions 14*b* and 14*i* of the T-form conductive pattern 14 not only act as current paths, but also contribute to heat transfer. This is because, as a copper pattern generally has far better heat conductivity than an insulator such as a ceramic, heat is not only transferred immediately below the semiconductor chip, but also spreads to the narrow portions 14*b* and 14*i*, is transferred to the heat releasing heat transferring pattern 15 on the cooling surface side, and further spreads over the whole of the cooling surface.

Also, as the gate electrode of the first semiconductor chip 12A in the main circuit components 13A and 13B is formed on the side opposite to that of the second semiconductor chip 12B, the paths of the gate wiring patterns 16*c* and 16*d* can be disposed without crossing the main circuit wiring patterns 16*a* and 16*b*, and wiring layout can thus be carried out easily.

Furthermore, as the conductive terminal pins 18 to 20, 21*a*, 21*b*, 22*a*, and 22*b* are disposed in two rows in a practically straight line along the longitudinal direction side edges of the power semiconductor module 2, the die for molding can be configured of the one fixed die 30 and the two sliding dies 31 and 32, as previously described using FIG. 9. Consequently, die manufacture becomes easier, and there is no impediment to the flow of the resin sealing member, because of which good molding can be carried out at a good yield.

Herein, when providing a gate terminal and an emitter auxiliary terminal on a longitudinal direction end surface side of a power semiconductor module, as described in PTL 5, the die for molding is such that it is necessary to provide three sliding dies 31, 32, and 33 that slide from three directions with respect to the one fixed die 30, as shown in FIG. 10. Therefore, the die fabrication cost rises, the sliding die 33 impedes the flow of the resin sealing member, and the gate terminal and emitter auxiliary terminal are disposed so as form an obstacle in the resin flow direction, because of which portions that the resin sealing member does not reach appear, voids occur, and the like, which are factors in yield deterioration.

Figure 11A:
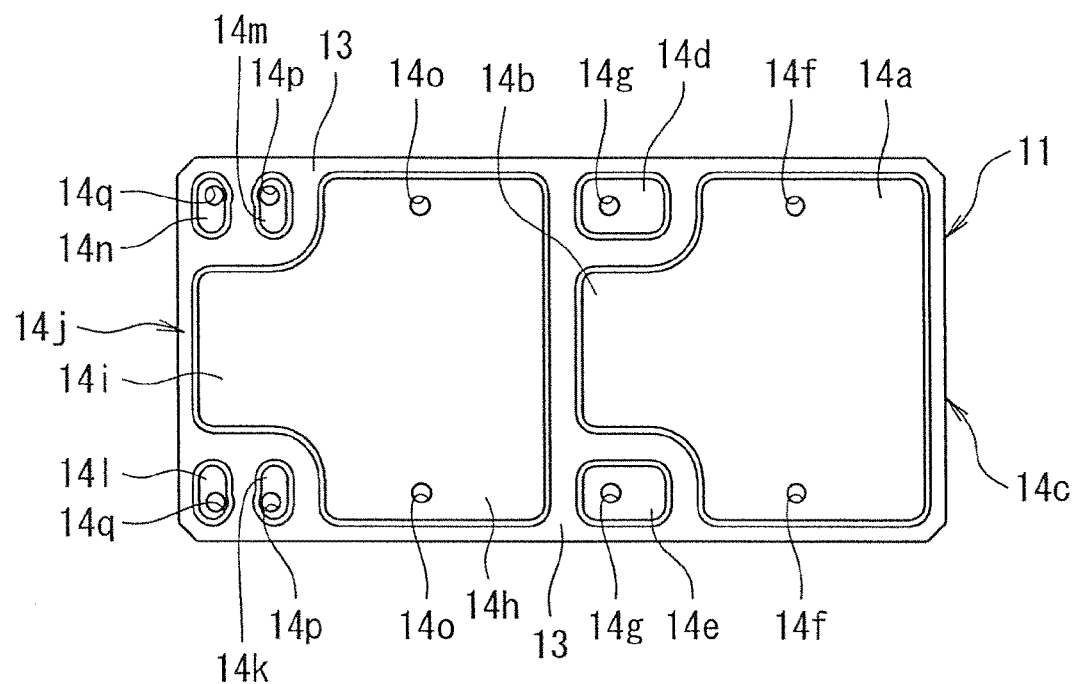
Figure 11B:
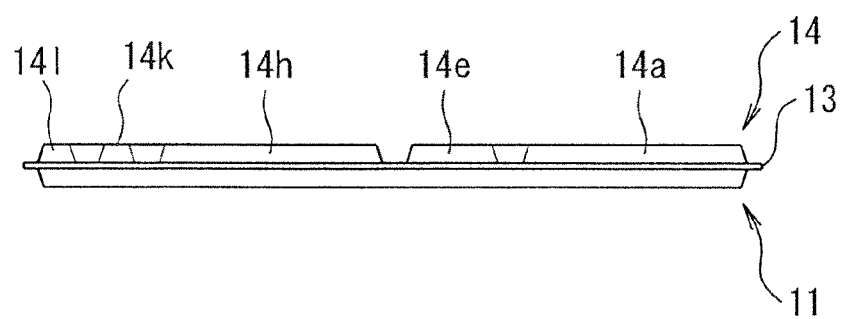
Figure 11C:
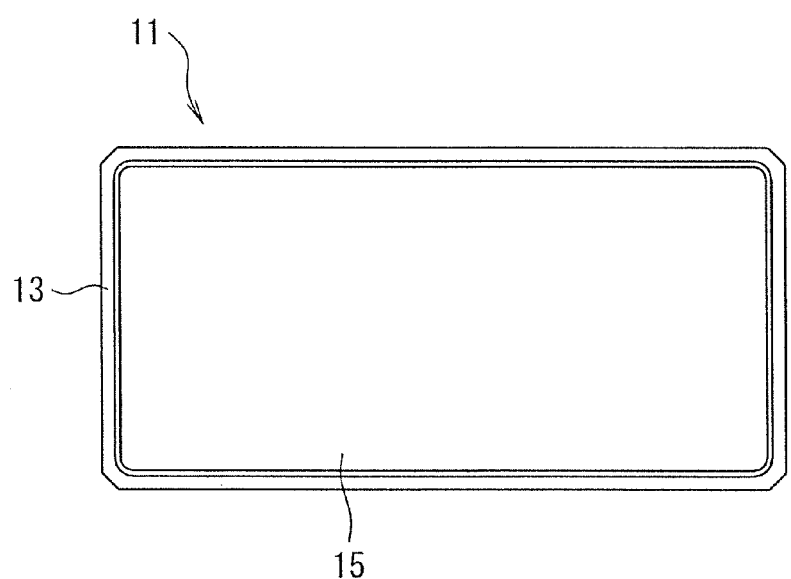
Figure 12A:
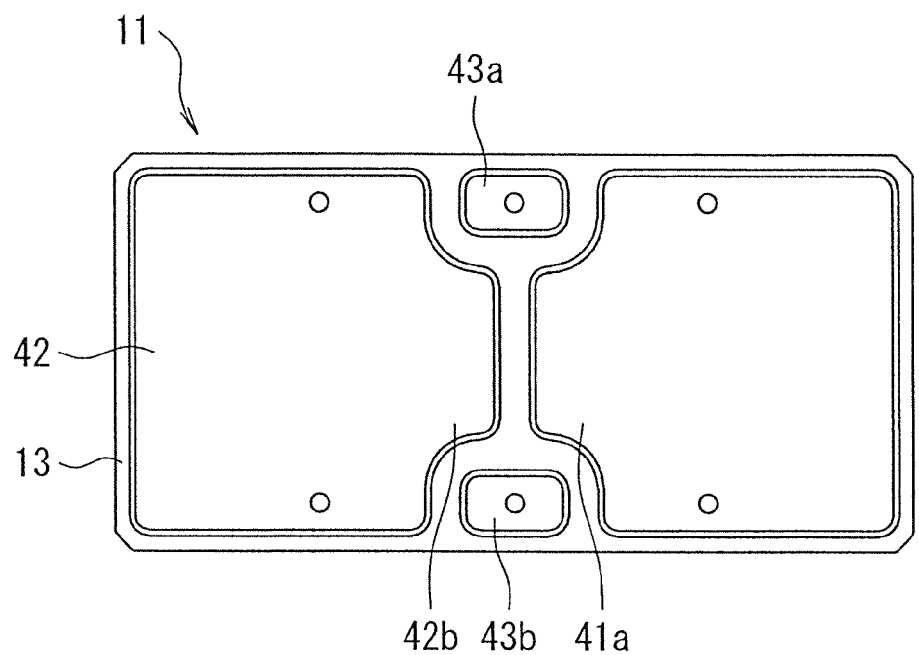
Figure 12B:
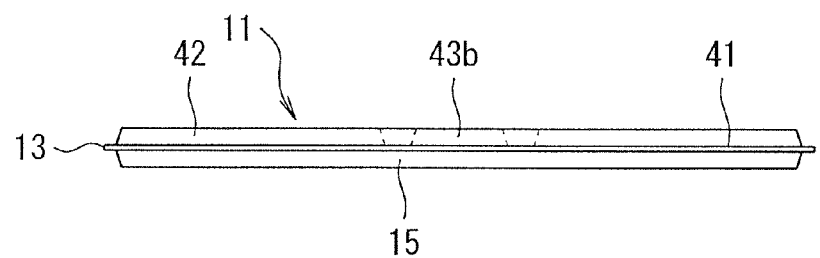
Figure 12C:
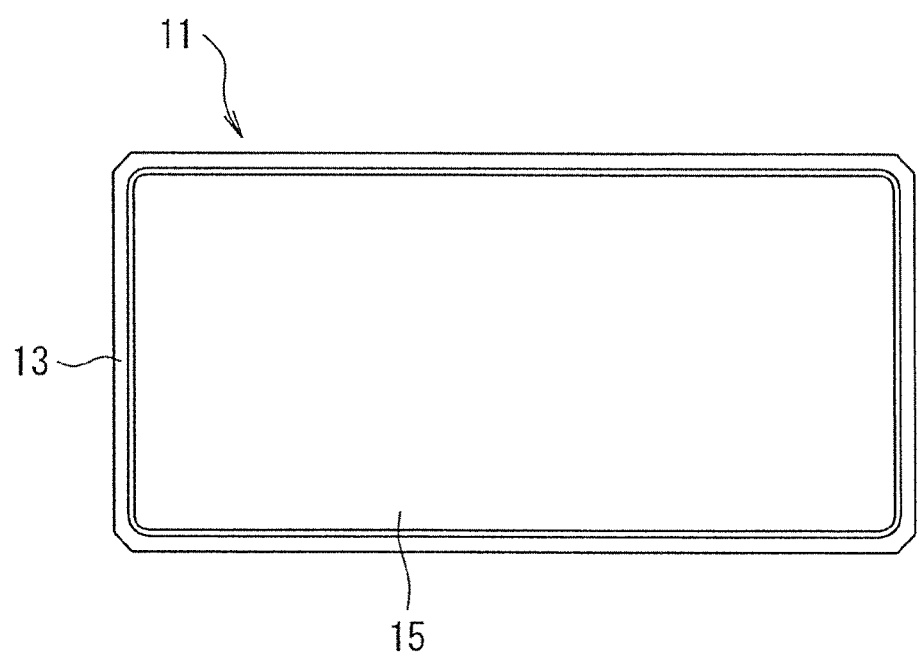

In the embodiment, a description has been given of a case wherein the insulating substrates 11A and 11B are provided for each main circuit component 13A and 13B but, this not being limiting, the conductive pattern 14 for the main circuit components 13A and 13B, and a common heat releasing heat transferring pattern 15, may be formed on one substrate 13, as shown in FIGS. 11A to 11C, when the difference in the linear expansion coefficients of the members configuring the insulating substrate and the sealing member is not a problem, or the like.

Also, in the embodiment, the insulating substrates 11A, 11B, and 11 not being limited to the heretofore described configuration, a so-called AMB (Active Metal Brazing) substrate, wherein a ceramic and copper are brazed and the copper is patterned by etching, or a DCB (Direct Copper Bonding) substrate wherein a ceramic substrate and copper are directly joined, can be applied. Also, alumina ($Al_2O_3$), aluminum nitride (AlN), silicon nitride ($Si_3N_4$), or the like, can be applied as a ceramic substrate material. Furthermore, a resin substrate can be applied instead of a ceramic substrate. That is, it is sufficient that the substrate is such that insulation can be secured.

Also, in the embodiment, a description has been given of a case wherein the printed circuit board 16 and the conductive pattern 14 and semiconductor chips 12A and 12B of the insulating substrates 11A and 11B are connected by the cylindrical post electrodes 17, 17*a*, and 17*b* but, this not being limiting, it is possible to apply post electrodes of an arbitrary form such as a quadrangular pillar, triangular pillar, polygonal pillar, or elliptical pillar, that is, it is sufficient that the post electrodes are rod-form conductive connection members that contribute to reducing inductance.

Also, in the embodiment, all the terminals are installed in an insulating substrate but, this not being limiting, terminals through which a large current does not flow, such as the gate and source auxiliary terminals, may be installed directly in a printed circuit board, as they do not need cooling. In this case, it is sufficient that the insulating substrate 11 is such that two T-form chip mounting patterns 41 and 42 are disposed so that narrow portions 41*a* and 42*b* oppose each other, and terminal connection patterns 43*a* and 43*b* are formed independently on either outer side sandwiching the two narrow portions 41*a* and 42*b*. In this case, compared with the heretofore described embodiment, problems occur in that there is a decrease in ease of assembly caused by standing terminals in two places, in the insulating substrate and printed circuit board, that the terminals standing in the printed circuit board are unstable when molding resin, and the like, but there are advantages in that the chip mounting pattern area increases, and cooling performance improves.

Figure 13:
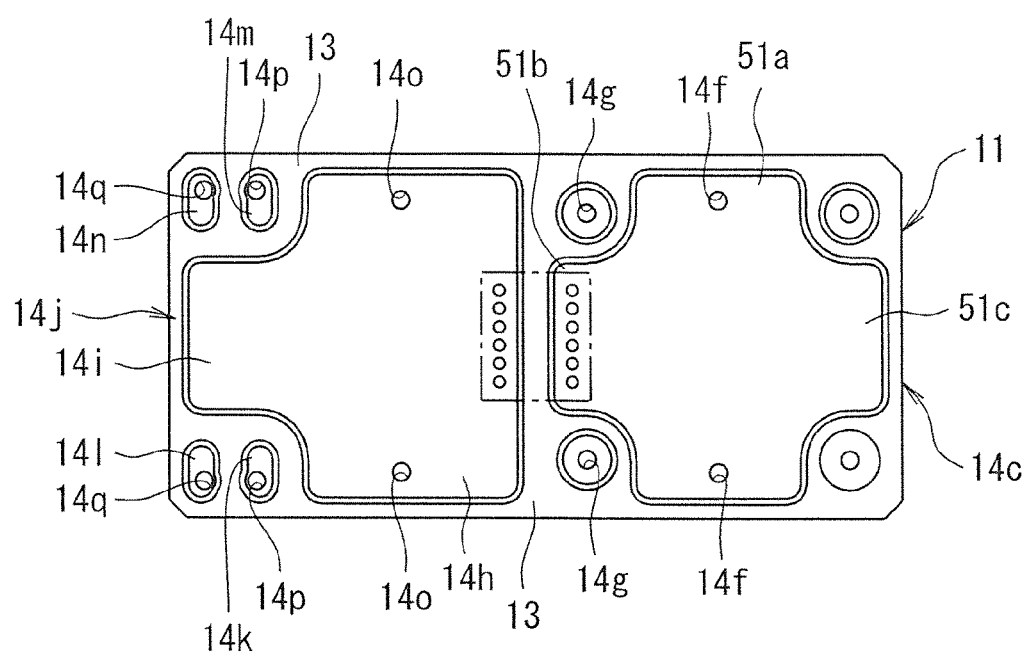
FIG. 13 is a plan view showing a third modification example of an insulating substrate.
Figure 14:
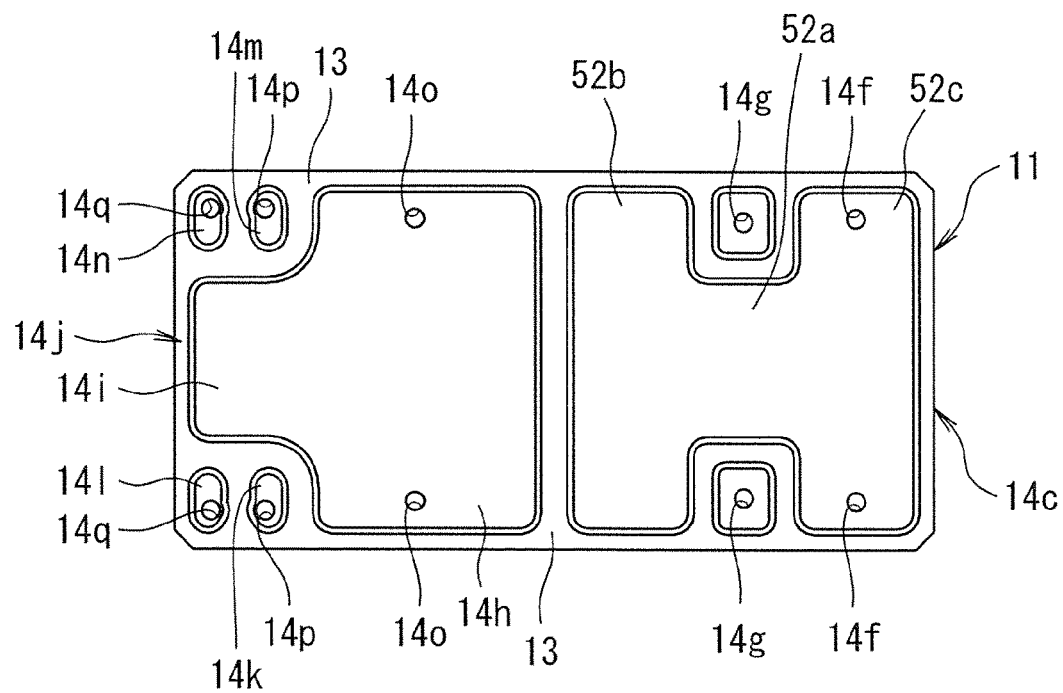
FIG. 14 is a plan view showing a fourth modification example of an insulating substrate.
Figure 15:
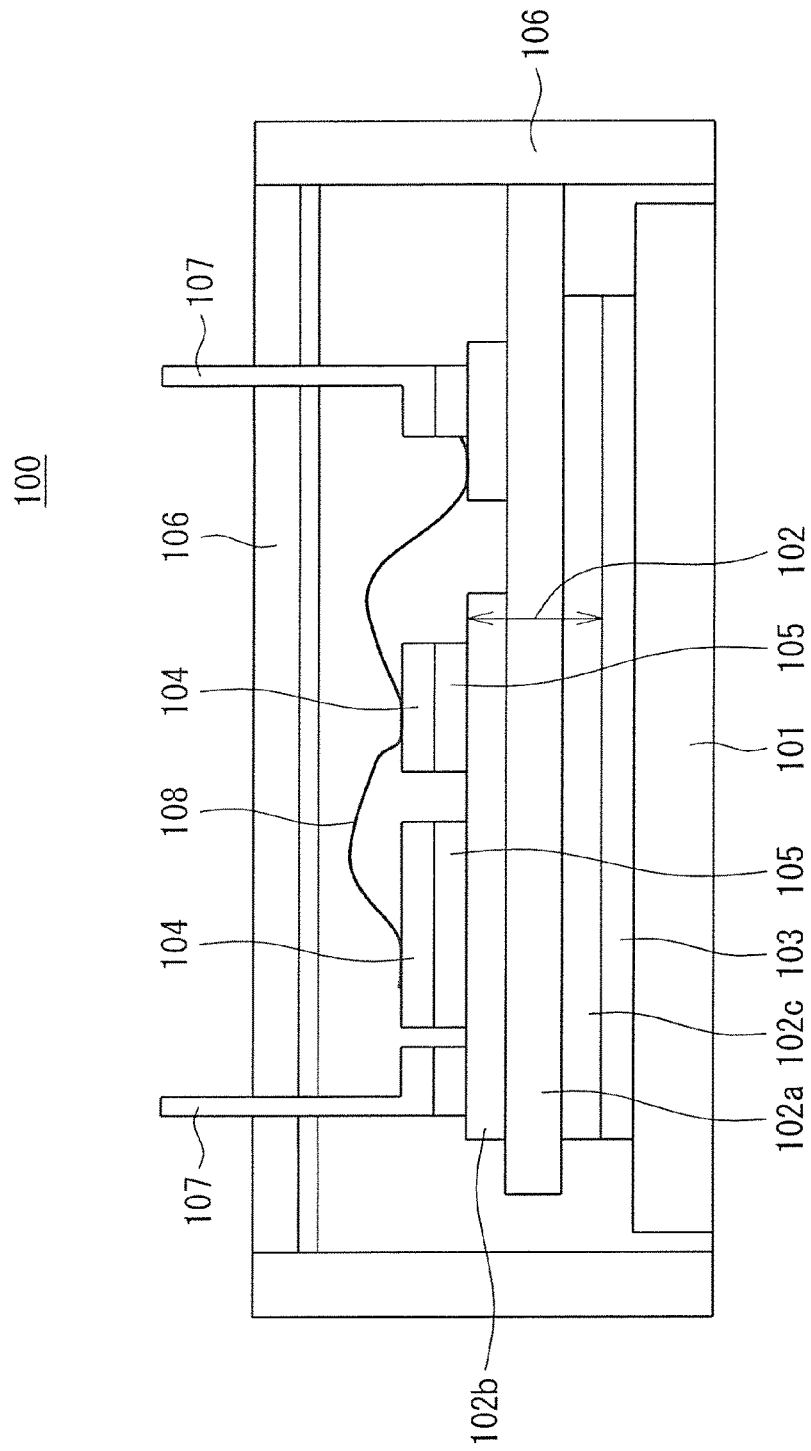
FIG. 15 is a sectional view showing an existing example.

Also, in the embodiment, a description has been given of a case wherein one each of a narrow portion and wide portion are formed as a chip mounting pattern but, this not being limiting, narrow portions 51*b* and 51*c* may be formed on either side sandwiching a central wide portion 51*a*, as shown in FIG. 13. Furthermore, wide portions 52*b* and 52*c* may be formed on either side sandwiching a central narrow portion 52*a*, as shown in FIG. 14.

Also, in the embodiment, a description has been given of a case wherein a power MOSFET is incorporated in the first semiconductor chip 12A but, this not being limiting, an IGBT may be incorporated in the first semiconductor chip 12A, or another voltage controlling semiconductor element may be incorporated. Also, instead of the combination of the first semiconductor chip 12A and second semiconductor chip 12B, a reverse conducting IGBT (RC-IGBT) incorporating a FWD may be used as the first semiconductor chip 12A.

Also, in the embodiment, a description has been given of a case wherein a plurality of the first semiconductor chip 12A and second semiconductor chip 12B are disposed on the insulating substrates 11A and 11B but, this not being limiting, it is also possible to omit the second semiconductor chip 12B and configure using only the first semiconductor chip 12A when it is possible to use a diode incorporating a transistor, when a synchronous rectification method is employed, and the like.

Also, lead frames or other terminals can be applied instead of the conductive terminal pins 18 to 20, 21a, 21b, 22a, and 22b as external connection terminals. Also, the direction in which the terminals protrude not being limited to the upper surface of the power semiconductor module 2, the terminals may be caused to protrude from a side surface and bent upward.

Also, as the invention is such that a desired circuit configuration is obtained simply by combining terminal connections of a semiconductor module, the invention, not being limited to the heretofore described power conversion inverter device, can be applied to another power conversion device using a power semiconductor module, or to another semiconductor device such as a high frequency application switching IC.

REFERENCE SIGNS LIST

1 . . . Semiconductor device, 2 . . . Power semiconductor module, 11A, 11B . . . Insulating substrate, 12A . . . First semiconductor chip, 12B . . . Second semiconductor chip, 13A, 13B . . . Main circuit component, 14 . . . Conductive pattern, 14a, 14h . . . Wide portion, 14b, 14i . . . Narrow portion, 14c, 14j . . . Chip mounting pattern, 14c, 14e, 14k, 14l, 14m, 14n . . . Terminal connection pattern, 15 . . . Heat releasing heat transferring pattern, 16 . . . Printed circuit board, 18 to 20, 21a, 21b, 22a, 22b . . . Conductive terminal pin, 24 . . . Molded body, 30 . . . Fixed die, 31, 32 . . . Sliding die

What is claimed is:
1. A semiconductor device, comprising:
a first conductive pattern member on which is mounted a first semiconductor chip;
a second conductive pattern member on which is mounted a second semiconductor chip; and
a printed circuit board on which are formed a first wiring pattern and a second wiring pattern, wherein
the first conductive pattern member is formed of a narrow portion and a wide portion,
the first semiconductor chip is connected to the first wiring pattern via a first rod-form connection member,
the second semiconductor chip is connected to the second wiring pattern via a second rod-form connection member,
the narrow portion of the first conductive pattern member is connected to the second wiring pattern via a third rod-form connection member,
the first conductive pattern member and second semiconductor chip are electrically connected via the third rod-form connection member, second rod-form connection member, and second wiring pattern, and
a terminal connection pattern member is formed on an outer side of the narrow portion, maintaining a predetermined interval from the narrow portion, between the first conductive pattern member and the second conductive pattern member.

2. The semiconductor device according to claim 1, wherein the first conductive pattern member and first wiring pattern are disposed opposing.

3. The semiconductor device according to claim 1, wherein the first wiring pattern of the printed circuit board is disposed so that signs of a change rate of current flowing through the first conductive pattern member and a change rate of current flowing through the printed circuit board opposing the first conductive pattern member are positive and negative opposite signs.

4. The semiconductor device according to claim 1, wherein the terminal connection pattern member connects to an external connection terminal.

5. The semiconductor device according to claim 1, wherein the first conductive pattern member and second conductive pattern member are configured of a copper pattern of a thickness of 0.5 mm or more but not more than 1.5 mm.

6. The semiconductor device according to claim 4, wherein the terminal connection pattern member is configured of a copper pattern of a thickness of 0.5 mm or more, which can hold the external connection terminal.

7. The semiconductor device according to claim 1, wherein the first conductive pattern member and second conductive pattern member are disposed on an insulating substrate.

8. The semiconductor device according to claim 1, wherein the first conductive pattern member and second conductive pattern member are disposed on individual insulating substrates.

9. The semiconductor device according to claim 7, wherein a heat releasing heat transferring pattern member is formed on a side of the insulating substrate opposite to a surface on which the first conductive pattern member and second conductive pattern member are formed, and a number of heat releasing heat transferring pattern members is set to be the same as, or smaller than, a number of first conductive pattern members and second conductive pattern members.

10. The semiconductor device according to claim 1, wherein the first wiring pattern and second wiring pattern are formed on both a front and a back surface of the printed circuit board, first wiring patterns have a same potential, and second wiring patterns have a same potential.

11. The semiconductor device according to claim 10, wherein the first semiconductor chip and second semiconductor chip are configured of a voltage controlling semiconductor element having a main electrode,
the main electrode of the first semiconductor chip is connected to the first wiring pattern, and the main electrode of the second semiconductor chip is connected to the second wiring pattern.

12. The semiconductor device according to claim 4, comprising a sealing member encapsulating in an interior thereof the first conductive pattern member and the printed circuit board, wherein the terminal connection pattern member includes a first pattern and a second pattern disposed maintaining a predetermined interval on the outer side of the narrow portion, the external connection terminal includes a first terminal connected to the first pattern and a second terminal connected to the second pattern, and the first terminal and second terminal are formed in positions symmetrical with respect to a central line in a width direction of the semiconductor device and protrude in a same direction from the sealing member.

13. The semiconductor device according to claim 1, wherein
each of the first semiconductor chip and second semiconductor chip is configured of a voltage controlling semiconductor element having a gate electrode and a current detecting auxiliary electrode,
a third wiring pattern connected to the gate electrode is formed on one surface of the printed circuit board, and
a fourth wiring pattern connected to the auxiliary electrode is formed in a position on another surface of the printed circuit board opposing the third wiring pattern.

14. The semiconductor device according to claim 7, wherein
each of the first semiconductor chip and second semiconductor chip is configured of a voltage controlling semiconductor element having a gate electrode, and
the gate electrode of the first semiconductor chip and the gate electrode of the second semiconductor chip are disposed so as to be positioned on an outer side of the insulating substrate in a longitudinal direction when a plurality of the insulating substrates are disposed.

15. The semiconductor device according to claim 8, wherein
each of the first semiconductor chip and second semiconductor chip is configured of a voltage controlling semiconductor element having a gate electrode, and
the gate electrode of the first semiconductor chip and the gate electrode of the second semiconductor chip are disposed so as to be positioned on an outer side of the insulating substrate in a longitudinal direction when a plurality of the insulating substrates are disposed.

16. The semiconductor device according to claim 1, wherein:
the terminal connection pattern member is formed so as to be disposed side by side with the narrow portion.

17. The semiconductor device according to claim 1, wherein:
the terminal connection pattern member connects to an external connection terminal, and one of side edges of the terminal connection pattern member coincides with one of side edges of the wide portion.

18. A semiconductor device, comprising:
a plurality of conductive pattern members, on each of which is mounted one or a plurality of power semiconductor chips; and
a printed circuit board wherein a chip rod-form conductive connection member connected to a power semiconductor chip of the one or the plurality of power semiconductor chips and a pattern rod-form conductive connection member connected to one of the plurality of conductive pattern members are disposed on a surface opposing the plurality of conductive pattern members, wherein
a wiring pattern of the printed circuit board is disposed so that signs of a change rate of current flowing through the plurality of conductive pattern members and a change rate of current flowing through the printed circuit board opposing the plurality of conductive pattern members are positive and negative opposite signs; and wherein:
the one of the plurality of conductive pattern members is formed of a narrow portion and a wide portion, and a terminal connection pattern member is formed on an outer side of the narrow portion, maintaining a predetermined interval from the narrow portion, between the one of the plurality conductive pattern members and another one of the plurality of conductive pattern members.

19. A semiconductor device, comprising:
a plurality of conductive pattern members, on each of which is mounted one or a plurality of power semiconductor chips; and
a printed circuit board on which is disposed a chip rod-form conductive connection member connected to a power semiconductor chip of the one or the plurality of power semiconductor chips, wherein
at least one conductive pattern member of the plurality of conductive pattern members is configured of a narrow portion and wide portion,
a current path is formed between the narrow portion of the at least one conductive pattern member and the power semiconductor chip connected to the chip rod-form conductive connection member, and via the chip rod-form conductive connection member to the printed circuit board,
the power semiconductor chip is configured of a voltage controlling semiconductor element having a gate electrode and a current detecting auxiliary electrode, and
of wiring patterns formed on the printed circuit board, a wiring pattern connected to the gate electrode is formed on one surface of the printed circuit board, and a wiring pattern connected to the current detecting auxiliary electrode is formed in a position on another surface of the printed circuit board opposing the wiring pattern connected to the gate electrode; wherein:
a terminal connection pattern member is formed on an outer side of the narrow portion, maintaining a predetermined interval from the narrow portion, between the at least one conductive pattern member and another conductive pattern member of the plurality of conductive pattern members.

20. A semiconductor device, comprising:
a first substrate having a first conductive pattern;
a second substrate having a second conductive pattern;
at least one first semiconductor chip on the first conductive pattern;
at least one second semiconductor chip on the second conductive pattern;
a printed circuit board having a first wiring pattern and a second wiring pattern; and
rod-form connecting members to electrically connect the printed circuit board to the at least one first semiconductor chip and the at least one second semiconductor chip;
wherein
in a plan view at least one of the first conductive pattern or the second conductive pattern includes a conductor outlining a main area and conductors each outlining one of a plurality of laterally adjacent areas, each of the plurality of laterally adjacent areas being smaller than the main area,
the main area has a narrow portion between the plurality of laterally adjacent areas, and
at least one of the plurality of laterally adjacent areas is a terminal connection pattern member formed on an outer side of the narrow portion, between the first conductive pattern member and the second conductive pattern member, and maintains a predetermined interval from the narrow portion.

21. The semiconductor device of claim 20, wherein the at least one first semiconductor chip is in the main area, and the connecting members include a first connecting member to connect the at least one first semiconductor chip in the main area to the first wiring pattern, a second connecting member to connect the at least one second semiconductor chip to the second wiring pattern, and a third connecting member to connect the first wiring pattern to a conductor of the conductors each outlining one of the plurality of laterally adjacent areas.

22. A semiconductor device, comprising:
- a first conductive pattern member on which is mounted a first semiconductor chip;
- a second conductive pattern member on which is mounted a second semiconductor chip; and
- a printed circuit board on which are formed a first wiring pattern and a second wiring pattern, wherein
- the first conductive pattern member is formed of a narrow portion and a wide portion,
- the first semiconductor chip is connected to the first wiring pattern via a first rod-form connection member,
- the second semiconductor chip is connected to the second wiring pattern via a second rod-form connection member,
- the narrow portion of the first conductive pattern member is connected to the second wiring pattern via a third rod-form connection member,
- the first conductive pattern member and second semiconductor chip are electrically connected via the third rod-form connection member, second rod-form connection member, and second wiring pattern, and
- a terminal connection pattern member is formed on an outer side of the narrow portion, maintaining a predetermined interval from the narrow portion;
- the semiconductor device further comprising:
- another terminal connection pattern member formed on another outer side of the narrow portion and maintaining the predetermined interval from the narrow portion;
- wherein the narrow portion is formed between the terminal connection pattern member and the other terminal connection pattern member.

\* \* \* \* \*